(12) United States Patent
Iwasaki et al.

(10) Patent No.: US 6,772,032 B2
(45) Date of Patent: Aug. 3, 2004

(54) SEMICONDUCTOR DEVICE MANUFACTURING LINE

(75) Inventors: Junji Iwasaki, Hyogo (JP); Kazuyuki Mori, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/388,632

(22) Filed: Mar. 17, 2003

(65) Prior Publication Data

US 2004/0045668 A1 Mar. 11, 2004

(30) Foreign Application Priority Data

Sep. 9, 2002 (JP) ........................................ 2002-262430

(51) Int. Cl.[7] .............................................. G06F 19/00
(52) U.S. Cl. .............. 700/113; 414/222.01; 414/331.18
(58) Field of Search ..................... 700/113; 414/222.01, 414/331.18; 118/719

(56) References Cited

U.S. PATENT DOCUMENTS

| | | | | |
|---|---|---|---|---|
| 4,818,169 A | * | 4/1989 | Schram et al. | ......... 414/331.18 |
| 4,974,166 A | * | 11/1990 | Maney et al. | ................ 700/113 |
| 6,312,525 B1 | * | 11/2001 | Bright et al. | ................ 118/719 |
| 6,579,052 B1 | * | 6/2003 | Bonora et al. | ......... 414/222.01 |

FOREIGN PATENT DOCUMENTS

| | | |
|---|---|---|
| JP | 06-291172 | 10/1994 |
| JP | 11-283892 | 10/1999 |
| JP | P2000-223401 A | 8/2000 |

* cited by examiner

Primary Examiner—John F. Niebling
Assistant Examiner—Andre C. Stevenson
(74) Attorney, Agent, or Firm—McDermott, Will & Emery LLP

(57) ABSTRACT

A product wafer processed by a semiconductor manufacturing apparatus is transferred to a check apparatus for checking, and a result thereof is sent to a host computer. A product wafer determined as being failed as a result of the checking is transported into an empty carrier by a built-in type wafer transport apparatus under the instruction of the host computer. The carrier in which the product wafer determined as being failed is accommodated is regarded as a rework lot by the host computer. Based on manufacturing standard information for rework held by the host computer, rework processing is performed through a wafer manufacturing operation. Therefore, such a semiconductor device manufacturing line results in that the carrier accommodating the product wafer is transferred and handled smoothly.

4 Claims, 29 Drawing Sheets

BACK

SEMICONDUCTOR DEVICE MANUFACTURING LINE

BACKGROUND OF THE INVENTION

1. Field of the Invention

The present invention relates to a semiconductor device manufacturing line, and more particularly to a semiconductor device manufacturing line in which a semiconductor wafer is accommodated in a carrier and transferred between steps.

2. Description of the Background Art

A semiconductor integrated circuit is formed by successively performing a film deposition process, a photolithography process, a processing process and the like on a semiconductor wafer using a variety of semiconductor facilities in a semiconductor device manufacturing line.

The semiconductor manufacturing facilities include a semiconductor manufacturing apparatus substantially processing a semiconductor wafer in each step, a check apparatus determining whether the processing by the semiconductor manufacturing apparatus is appropriate, a transfer apparatus transferring a carrier which accommodates a semiconductor wafer, a stocker storing the carrier and the like.

In the semiconductor device manufacturing line, the operation of each semiconductor manufacturing facility is executed by a program that is built in a host computer in advance. Under the control of this program, the semiconductor wafer is accommodated in a prescribed carrier and transferred between process steps.

The method of operating the semiconductor manufacturing facility includes, for example, three operations: a wafer applying operation; a wafer manufacturing operation; and a wafer completing operation. A substantial operation for forming a semiconductor integrated circuit on a semiconductor wafer is carried out through the wafer manufacturing operation.

A rework processing operation and a carrier exchanging operation will be described as an exemplary wafer manufacturing operation.

First, the rework processing operation will be described. The rework processing operation refers to an operation in which when the processing performed on a semiconductor wafer by the semiconductor manufacturing apparatus is failed (out of specification) as a result of a prescribed check apparatus checking, that semiconductor wafer is restored to a state prior to that processing and the same processing is then performed on that semiconductor wafer again.

FIG. 21 shows a bay 119 at one step. Bay 119 is provided with four manufacturing apparatuses 110a–110d, one check apparatus 116, a wafer transport apparatus 148, a manual rack 149, an intra-bay transfer apparatus 120, and a stocker 121. It is noted that manual rack 149 stores a carrier. Stocker 121 is connected to intra-bay transfer apparatus 120 and an inter-bay transfer apparatus 122.

A rework operation is performed based on a check result of check apparatus 116. As shown in FIG. 22, the conventional check apparatus 116 is provided with a load port 111 receiving the carrier in which a semiconductor wafer is accommodated, similar to semiconductor manufacturing apparatus 110. Here, two load ports 111, that is, a left load port 111a and a right load port 111b are provided for performing successive processing.

A reader 112 for reading a carrier ID is attached to each load port 111. When a carrier is transferred to load port 111, reader 112 reads the carrier ID to identify that carrier ID with the instruction from host computer 114.

Load port 111 is also provided with an opening/closing mechanism (not shown) for opening and closing a carrier door of the carrier. Furthermore, check apparatus 116 is provided with a carrier movement communication interface 113 and a control carrier communication interface 115.

Carrier movement communication interface 113 indicates that a carrier is externally applied or ejected. Control communication interface 115 communicates semiconductor wafer processing information and the like with host computer 114.

The conventional check apparatus 116 is provided with a failure load port 117. This failure load port 117 is a port arranged for externally delivering a dedicated carrier into which a semiconductor wafer determined to be failed through the check is ejected (referred to as "NG carrier" hereinafter). It is noted that the semiconductor wafer determined to be passed is returned to the carrier placed on the original load port 111.

In the rework operation, intra-bay transfer apparatus 120 connects semiconductor manufacturing apparatus 110, check apparatus 116 and stocker 121 for transferring the carrier.

However, NG carrier is transferred by an operator 147 to wafer transport apparatus 148, manual rack 149 and stocker 121.

The carrier flow will now be described. Under the instruction of the host computer (not shown), as shown in FIG. 21, the carrier accommodating a semiconductor wafer for which processing is completed in semiconductor manufacturing apparatus 110b (operation pk27) is transferred by intra-bay transfer apparatus 120 from load port 111 of semiconductor manufacturing apparatus 110b to load port 111 of check apparatus 116 (operation pk28).

Check apparatus 116 checks a product wafer accommodated in the carrier to determine it is passed or failed as to whether the processing by semiconductor manufacturing apparatus 110 is properly performed. The product wafer determined as being passed is returned to the original carrier. On the other hand, the product wafers determined as being failed are collected by operator 147 into NG carrier arranged at failure load port 117 (operation pk29).

After all product wafers have been checked, the carrier that accommodates the product wafer determined as being passed (referred to as "parent lot" hereinafter) is transferred by intra-bay transfer apparatus 120 to intra-bay application port 139 (operation pk30). This parent lot is conveyed from intra-bay application port 139 to a shelf 134 of stocker 121 by a crane 133 and is accommodated in stocker 121 (operation pk30x).

Meanwhile, NG carrier is removed from failure load port 117 of check apparatus 116, transferred to manual rack 149 by operator 147 (operation pk31) and stored there temporarily.

Under the instruction of the host computer, the parent lot accommodated in stocker 121 is ejected to manual ejection port 136 (operation pk32). The parent lot ejected to manual ejection port 136 is transferred to manual rack 149 (operation pk33). Then, NG carrier is matched with the parent lot.

Then, NG carrier is regarded as a rework lot by operator 147 through the host computer, and the rework processing for the accommodated product wafer is started. First, as shown in FIG. 23, the rework lot on manual rack 149 is transferred to manual application port 135 of stocker 121 (operation pk34).

The rework lot transferred to manual application port 135 is once accommodated in stocker 121 (operation pk35). The rework lot accommodated in stocker 121 is subjected to the rework processing through the wafer manufacturing operation in accordance with manufacturing standard information for rework, held by the host computer.

The rework lot accommodated in stocker 121 is then transferred by inter-bay transfer apparatus 122 to the next step (operation pk36). As shown in FIG. 24, the rework lot transferred to the next step is then transferred by inter-bay transfer apparatus 122 and accommodated in stocker 121 in accordance with the wafer manufacturing operation under the instruction of the host computer (operation pk37).

In response to the demand, for example, from manufacturing apparatus 110*b* in the next step, the rework lot is ejected to intra-bay ejection port 140 (operation pk38). The rework lot on intra-bay ejection port 140 is transferred to load port 111 of manufacturing apparatus 110*b* by intra-bay transfer apparatus 120 (operation pk39). Manufacturing apparatus 110*b* processes the rework lot (operation pk40).

The rework lot for which manufacturing apparatus 110*b* completes the processing is transferred from load port 111 to the load port of check apparatus 116 (operation pk41). In check apparatus 116, the product wafer in the transferred rework lot is checked (operation pk41*x*).

The rework lot in which the check for all product wafers is completed is transferred from load port 111 to intra-bay application port 139 of stocker 121 (operation pk42). Thereafter, the rework lot is accommodated from intra-bay application port 139 into stocker 121 (operation pk43).

As shown in FIG. 25, the rework lot accommodated in stocker 121 is then ejected to manual ejection port 136 under the instruction of the host computer (operation pk44). The ejected rework lot is transferred by operator 147 from manual ejection port 136 to manual rack 149 (operation pk45).

After operator 147 confirms that all the rework processing for the product wafer in the rework lot has been completed, operator 147 transfers the parent lot thereof from manual rack 149 to load port 111*b* of wafer transport apparatus 148 (operation pk47).

The rework lot is also transferred from manual rack 149 to load port 111*b* of wafer transport apparatus 148 (operation pk46). Wafer transport apparatus 148 then transports the product wafer in the rework lot into the carrier of the parent lot (operation pk48).

Then, as shown in FIG. 26, the parent lot in which the transfer of the product wafer is completed is transferred to manual application port 135 of stocker 121 by operator 147 (operation pk49). The carrier transferred to manual application port 135 is once accommodated in stocker 121 (operation pk50).

Thereafter based on the manufacturing standard information for that carrier, held by the host computer, the semiconductor manufacturing apparatus that will process the product wafer next is decided and the carrier is transferred to the nearest stocker 121 in the next step by inter-bay transfer apparatus 122 (operation pk51). A series of the rework processing operations is thus completed.

It is noted that after the carrier that has accommodated the product wafer determined as being failed is temporarily stored by operator 147, it is again returned to failure load port 117 of check apparatus 116 for use in the rework processing (operation pk52).

The conventional rework processing operation using the host computer as described above can be divided into processing for the parent lot and processing for the rework lot. As described above, in the parent lot, the product wafer formed in the wafer applying operation is accommodated in one carrier.

On the other hand, in the rework lot, the product wafer separated from the parent lot is accommodated in one carrier as being determined as being failed by the check apparatus after a prescribed semiconductor manufacturing apparatus performs prescribed processing.

First, as shown in FIG. 27, the rework processing for the parent lot is started when the processing performed by manufacturing apparatus 110 is completed and that processing is checked (step ps1). Then, the parent lot is checked by check apparatus 116 (step ps2). If all product wafers are passed, all the product wafers are accommodated in the original carrier, and a series of processing is completed (step ps4).

If even a single product wafer is failed at step ps2, however, the processing for the parent lot is temporarily suspended as shown in step ps3. In this case, the failed product wafer is temporarily stored in stocker 121, waiting for the determination of operator 147.

Next, as shown in FIG. 28, the processing for the rework lot is started upon operator 147 determining the failed product wafer (step ps5). Then, the rework lot which corresponds to the parent lot and is recognized by the host computer is formed (step ps6). The rework processing for the rework lot is then carried out (step ps7). After the completion report from operator 147, the completion processing for the rework lot is carried out (step ps8). A series of rework lot processing is thus completed (step ps9).

After the processing for the rework lot is completed, that product wafer is transported by wafer transport apparatus 148 to the carrier of the parent lot of which processing has been suspended temporarily, and all product wafers 2*a* are gathered. Thereafter operator 147 lifts the suspension of operation progress, and a series of operations is completed (step ps4).

The conventional rework processing operation has been carried out in the manner described above.

The conventional carrier exchanging operation will now be described. FIGS. 29 and 30 show a built-in type wafer transport apparatus 141 for use in the carrier exchanging operation, along with stocker 121.

Built-in type wafer transport apparatus 141 is provided with crane load ports 143*a* and 143*b* at a position relative to load ports 11*a* and 111*b* of wafer transport apparatus 148, and crane 133 of stocker 121 delivers the carrier.

It is noted that wafer transport apparatus 148 is provided with a filter-fan unit FFU 142 for keeping cleaness of the environment in which the product wafer is handled, a carrier door opening/closing mechanism 144 opening and closing the door of the carrier, and a wafer transferring robot 145.

Wafer transferring robot 145 is used to pick up a particular semiconductor wafer from the carrier and transfer it to a different carrier. Wafer transferring robot 145 is equipped with a device reading a wafer ID. It is noted that stocker 121 having built-in wafer transport apparatus 141 is called a hybrid stocker 121*a* as one kind of stocker 121.

FIG. 31 shows a bay 119 in one step. Bay 119 is arranged with four manufacturing apparatuses 110*a*–110*d*, intra-bay transfer apparatus 120 and inter-bay transfer apparatus 122, in addition to built-in type wafer transport apparatus 141 and hybrid stocker 121a as described above. Hybrid stocker 121a in this bay 119 is connected to a stocker in another bay through inter-bay transfer apparatus 122.

As shown in FIG. 31, the processing of a product wafer by semiconductor manufacturing apparatus 110 is completed in accordance with the step control operation of the wafer manufacturing operation (operation pk53). The host computer (not shown) refers to the manufacturing standard information of this product wafer, and an exchange flag in the next step is examined.

If the exchange flag is ON (to be exchanged), the carrier exchanging operation is started. On the other hand, if the exchange flag is OFF (not to be exchanged), the step control operation continues.

When the carrier exchanging operation is started, as a series of operations for receiving a carrier in the nearest hybrid stocker 121a, first of all, a carrier is transferred from semiconductor manufacturing apparatus 110b to intra-bay application port 139 of stocker 121 (operation pk54). The carrier transferred to intra-bay application port 139 is once accommodated in hybrid stocker 121a (operation pk55).

The carrier once accommodated is placed at crane load port 143b of built-in type wafer transport apparatus 141 from shelf 134 by crane 133 (operation pk56). An empty carrier which is stored in hybrid stocker 121a in advance is placed from shelf 134 to crane load port 143a by crane 133 (operation pk57).

Then, the product wafer in the carrier placed at crane load port 143b is transported into the empty carrier placed at crane load port 143a, by built-in type wafer transport apparatus 141 under the instruction of the host computer (operation pk58).

Then, as shown in FIG. 32, after the operation of transporting the product wafer is completed, the emptied carrier is once accommodated in hybrid stocker 121a (operation pk59). On the other hand, the carrier that has accommodated the product wafer is also once accommodated in hybrid stocker 121a (operation pk60).

The carrier that has accommodated the product wafer is transferred by inter-bay transfer apparatus 122 to a bay in which the processing for the next step (operation pk61), and the next wafer step starting operation continues.

On the other hand, the emptied carrier is cleaned for the next carrier exchanging operation under the control of the host computer. A series of carrier exchanging operations is thus completed.

The conventional carrier exchanging operation described above will be described using a block diagram. As shown in FIG. 33, first, each carrier is registered in the host computer and enters a carrier control state pb1, for use in the semiconductor device manufacturing line.

The carrier in carrier control state pb1 is unconditionally brought into an uncleaned empty carrier state pb4 (state transition pta). The carrier in uncleaned state pb4 is cleaned by a carrier cleaning apparatus (not shown) under the control of the host computer and then enters a cleaned empty carrier state pb2 (state transition pt3).

Any empty carrier in cleaned empty carrier state pb2 is selected when an empty carrier to be exchanged is required, before the carrier that is emptied through the carrier exchanging operation is transferred from shelf 134 of hybrid stocker 121a to crane load port 143a of built-in type wafer transport apparatus 141 as shown in FIG. 31 (operation pk57).

The selected empty carrier is transferred from shelf 134 of hybrid stocker 121a to crane load port 143a of built-in type wafer transport apparatus 141 (operation pk57) for use in the carrier exchanging operation.

When a product wafer is transported into that empty carrier by built-in type wafer transport apparatus 141 (operation pk58), as shown in FIG. 33, that carrier accommodates the product wafer and enters a filled carrier state pb3 (state transition pt1).

When the carrier in filled carrier state pb3 is emptied through the carrier exchanging operation, it unconditionally enters uncleaned empty carrier state pb4 (state transition pt2). The empty carrier in uncleaned empty carrier state pb4 is cleaned by the carrier cleaning apparatus under the control of the host computer and enters cleaned empty carrier state pb2 (state transition pt3).

In this way, each carrier is repeatedly used based on the carrier exchanging operation. The conventional carrier exchanging operation has been carried out as described above.

As described above, the product wafer is accommodated in a prescribed carrier and transferred between steps in the semiconductor manufacturing line. The conventional semiconductor manufacturing line, however, has the following problems in transferring or handling a carrier in this manner.

First, in the rework operation in the conventional semiconductor device manufacturing line, as described above, the product wafer that has been processed by each semiconductor manufacturing apparatus is determined by a prescribed check apparatus 116 as to whether that processing is properly performed. The product wafer on which the processing is not performed properly is distinguished as a failed product wafer from a passed product wafer on which the processing is properly performed.

The product wafer determined as being failed is accommodated in a prescribed NG carrier placed at failure load port 117 of check apparatus 116. In order to perform the rework processing on that product wafer determined as being failed, a rework lot is formed for the NG carrier accommodating the failed product wafer. The failed product wafer is transferred to a prescribed corresponding semiconductor manufacturing apparatus and the like for prescribed rework processing.

At this point, it has been necessary for the operator to manually create a database for the rework lot for the host computer in advance. Therefore it is not possible to carry out the rework processing timely, and the production period of the semiconductor device becomes longer.

In the carrier exchanging operation in the conventional semiconductor device manufacturing line, as described above, a carrier is used immediately after being cleaned, as an empty carrier required for exchange.

Therefore, each time a carrier is emptied through the carrier exchanging operation, that emptied carrier is transferred to a prescribed cleaning apparatus for cleaning.

As a result, the frequent transfer of the emptied carrier adversely affects the transfer of the carrier accommodating a product wafer, and a smooth transfer may be interrupted. Moreover, the costs for cleaning carriers and securing an appropriate number of carriers are inevitably increased. In addition, a space for storing the carriers is necessary.

SUMMARY OF THE INVENTION

An object of the present invention is to provide a semiconductor device manufacturing line to address the aforementioned problems in transferring or handling a carrier accommodating a product wafer.

According to one aspect of the present invention, a semiconductor device manufacturing line for manufacturing a semiconductor device using a container accommodating a semiconductor wafer includes a manufacturing apparatus, a check apparatus, one container and another container, a wafer transport apparatus, a storage apparatus, a transfer apparatus, and a control apparatus. The manufacturing apparatus performs prescribed processing on the semiconductor wafer. The check apparatus checks whether the processing performed on the semiconductor wafer by the manufacturing apparatus is appropriate. One container and another container respectively accommodate a prescribed number of semiconductor wafers. The wafer transport apparatus has a function of taking a prescribed semiconductor wafer determined as not being processed appropriately and requiring rework processing out of a prescribed number of semiconductor wafers checked by the check apparatus and accommodated in one container for transporting from one container into another container, and returning the prescribed semiconductor wafer transported into another container and subjected to the rework processing to the original one container. The storage apparatus stores one container and another container. The transfer apparatus transfers one container and another container to the manufacturing apparatus, the check apparatus, the storage apparatus and the wafer transport apparatus. The control apparatus controls the operations of the manufacturing apparatus, the check apparatus, the storage apparatus, the wafer transport apparatus and the transfer apparatus.

In accordance with this configuration, a determination result of the each semiconductor wafer by the check apparatus is stored by the control apparatus, and based on the check result, a semiconductor wafer determined as being failed is picked out from one container and transported into another container for forming a rework lot. Therefore the rework lot which is conventionally formed by the operator is formed timely and the container can be transferred efficiently. Furthermore, the manufacturing period can be shortened. In addition, the space for placing the container for the rework lot, which is required in the conventional check apparatus, needs not be provided in the check apparatus since the wafer transport apparatus transfers the semiconductor wafer determined as being failed from one container to another container. As a result, the serviceability ratio of the check apparatus can be improved and the area occupied by the check apparatus can be decreased.

According to another aspect of the present invention, a semiconductor device manufacturing line for manufacturing a semiconductor device using a container accommodating a semiconductor wafer has a plurality of containers, a storage apparatus, a wafer transport apparatus, a container cleaning apparatus, a transfer apparatus, and a control apparatus. A plurality of containers each accommodate a prescribed number of semiconductor wafers. The storage apparatus stores a plurality of containers. The wafer transport apparatus has a function of transporting a semiconductor wafer accommodated in one container among a plurality of containers to another container. The container cleaning apparatus cleans a plurality of containers. The transfer apparatus transfers each of a plurality of containers to the storage apparatus, the wafer transport apparatus and the container cleaning apparatus. The control apparatus includes functions of handling information regarding a container history including an elapsed time after cleaning by the container cleaning apparatus, the number of times of exchange and a purpose of use for each of plurality of containers, and of operating the storage apparatus, the wafer transport apparatus, the container cleaning apparatus and the transfer apparatus based on the information regarding the container history.

In accordance with this configuration, since the information regarding the container (carrier) history including an elapsed time after cleaning a container, a purpose of use and the number of times of use is handled by the control apparatus, it is easily determined whether a container emptied through the transport of the semiconductor wafer is reusable as an empty container. Therefore the cleaning of the empty container is appropriately limited based on the container history, as compared with the conventional carrier exchanging operation in which an empty container is cleaned each time it is emptied. As a result, it is less likely that the transfer of the container mounted with a semiconductor wafer and the transfer for the empty container affect each other due to the frequent transfer of the empty container, so that an efficient transfer can be realized. Furthermore, it is possible to reduce the unnecessary steps of cleaning an empty container, to minimize the number of cleaning apparatuses as required, and to cut down on the running cost for the cleaning step. In addition, the container is no longer cleaned frequently and the lifetime of the container can be prolonged.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device is manufactured by accommodating a product wafer in a carrier for transferring between steps in a semiconductor device manufacturing line. First, the entire manufacturing flow will be schematically described, and thereafter a rework operation and a carrier cleaning operation will be described.

Figure 1:
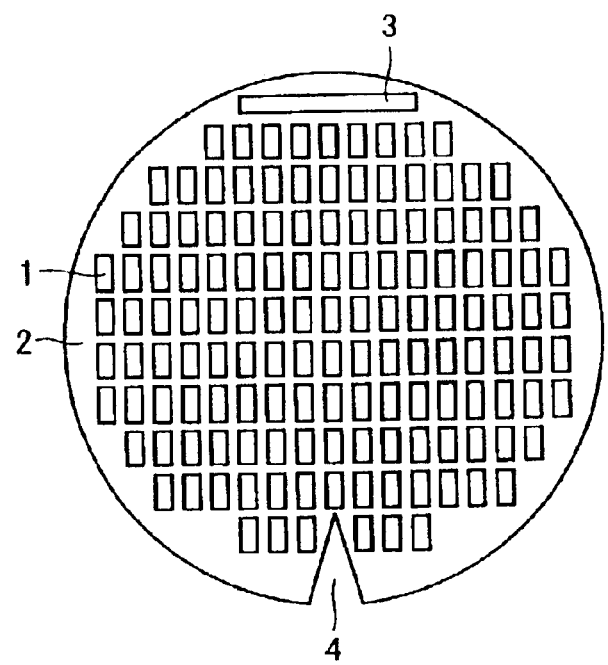
FIG. 1 shows a semiconductor wafer used in a semiconductor device manufacturing line in accordance with a first embodiment of the present invention.

As shown in FIG. 1, a semiconductor device is formed by patterning a plurality of semiconductor integrated circuits on a semiconductor wafer 2. Semiconductor wafer 2 includes a product wafer 2a and a non-product wafer. Product wafer 2a is a wafer on which a semiconductor integrated circuit 1 is formed as a product.

On the other hand, the non-product wafer is a wafer for auxiliary use to manufacture product wafer 2a. Specifically, the non-product wafer is used to control the state of an apparatus such as a semiconductor manufacturing apparatus or a check apparatus. The non-product wafer is also used to know the state of processing performed on the product wafer by the semiconductor manufacturing apparatus.

As shown in FIG. 1, a wafer ID 3 for identifying a wafer is printed on a prescribed position of semiconductor wafer 2. A notch 4 for recognizing a wafer 2 direction (crystal orientation) is also provided on semiconductor wafer 2.

Figure 2:
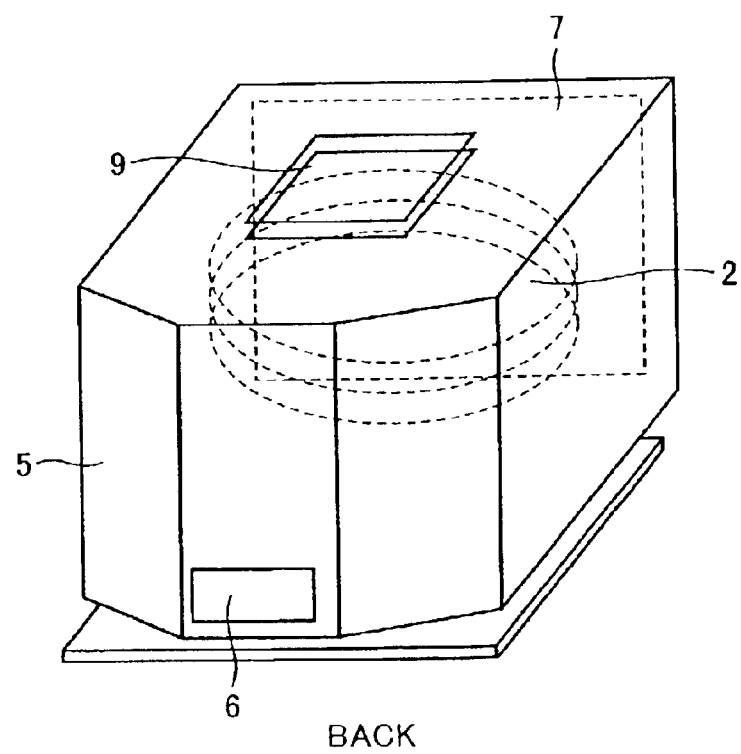
FIG. 2 is a perspective view showing a carrier for accommodating the semiconductor wafer shown in FIG. 1 in the same embodiment.

In the semiconductor device manufacturing line, a prescribed number of semiconductor wafers 2 are accommodated in a carrier for transferring. As shown in FIG. 2, a carrier ID 6 for identifying a carrier is printed on the back surface of a carrier 5. On the front surface of carrier 5, a carrier door 7 which can be opened/closed externally is provided. Carrier 5 is also provided with a handling flange 9 for facilitating the transfer.

Figure 3:
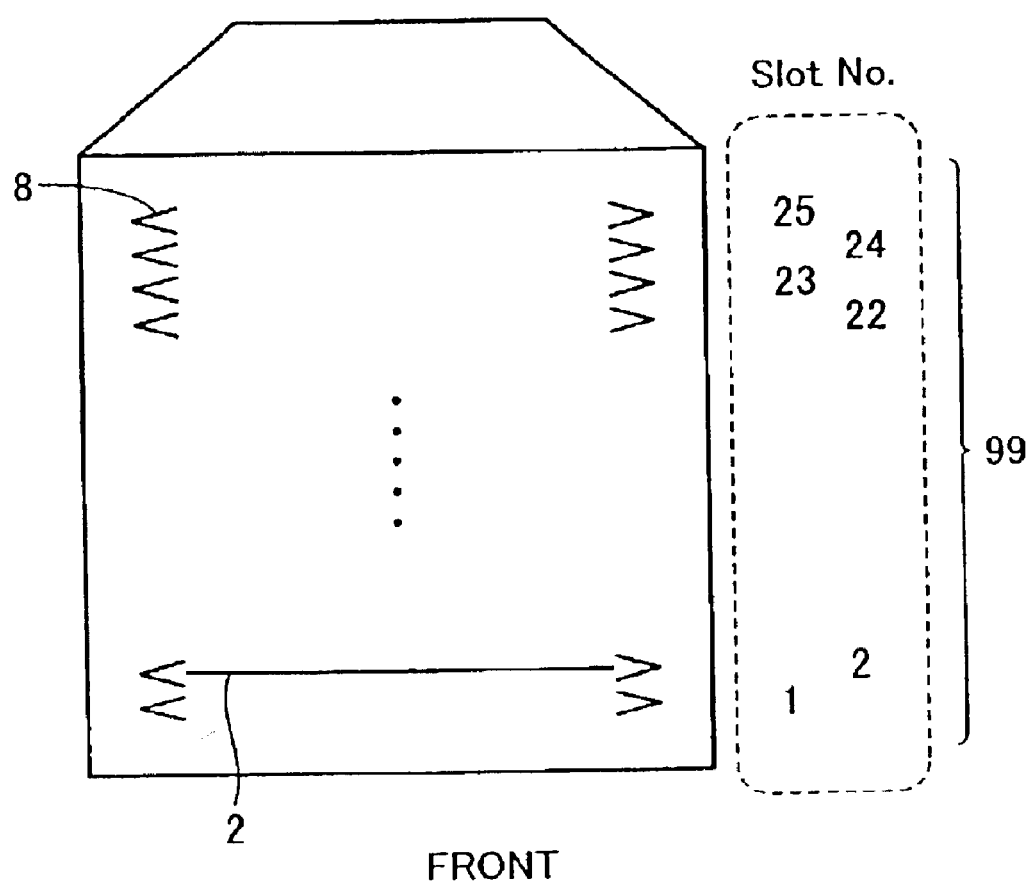
FIG. 3 is another perspective view showing the carrier for accommodating the semiconductor wafer shown in FIG. 1 in the same embodiment.

As shown in FIG. 3, a plurality of wafer slots 8 holding semiconductor wafer 2 horizontally are formed inside carrier 5. In the case of this carrier 5, twenty-five wafer slots 8 are formed to accommodate twenty-five semiconductor wafers 2. A series of multiple semiconductor wafers 2 accommodated in carrier 5 forms a lot 99. The inside of carrier 5 accommodating semiconductor wafer 2 is shielded from the outside by closing carrier door 7.

Carrier 5 has a state in which semiconductor wafer 2 is accommodated and a state in which it is not accommodated. A carrier in the state in which semiconductor wafer 2 is accommodated is regarded as a filled carrier and a carrier in the state in which semiconductor wafer 2 is not accommodated is regarded as an empty carrier.

Figure 4:
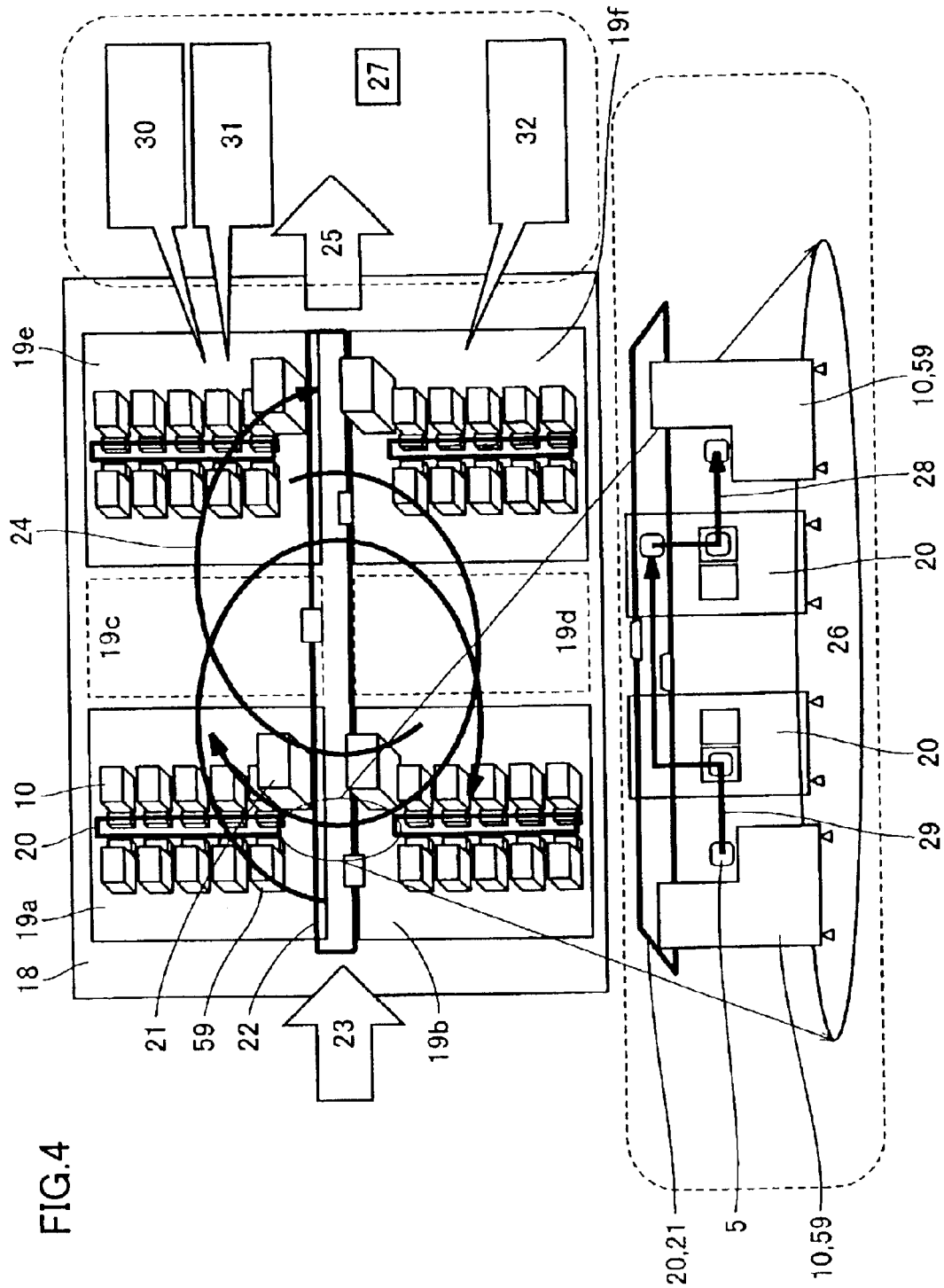
FIG. 4 is a plan view showing the semiconductor device manufacturing line in the same embodiment.

The configuration and operation method of the semiconductor device manufacturing line in which a carrier accommodating a product wafer is transferred will now be described. As shown in FIG. 4, the semiconductor device manufacturing line is configured with a plurality of bays 19 arranged with a manufacturing apparatus 10 and a check apparatus 16.

This semiconductor device manufacturing line is configured with six bays 19a–19f. One bay 19 is provided with semiconductor manufacturing apparatus 10, check apparatus 16, an intra-bay transfer apparatus 20 and a stocker 21. The semiconductor wafer accommodated in carrier 5 is transferred to semiconductor manufacturing apparatus 10 and check apparatus 16 by intra-bay transfer apparatus 20. Stocker 21 is connected with intra-bay transfer apparatus 20 for storing carrier 5 for the bay.

Stocker 21 is installed in each bay 19 and is connected through inter-bay transfer apparatus 22. These inter-bay transfer apparatus 22 and intra-bay transfer apparatus can transfer the semiconductor wafer accommodated in carrier 5 to all of the semiconductor manufacturing apparatuses 10 and check apparatuses 16 in a semiconductor manufacturing facility 18.

An exemplary semiconductor manufacturing apparatus arranged in such a semiconductor device manufacturing line will now be described. The semiconductor manufacturing apparatus is an apparatus for performing substantial processing for forming a semiconductor integrated circuit 1.

Figure 5:
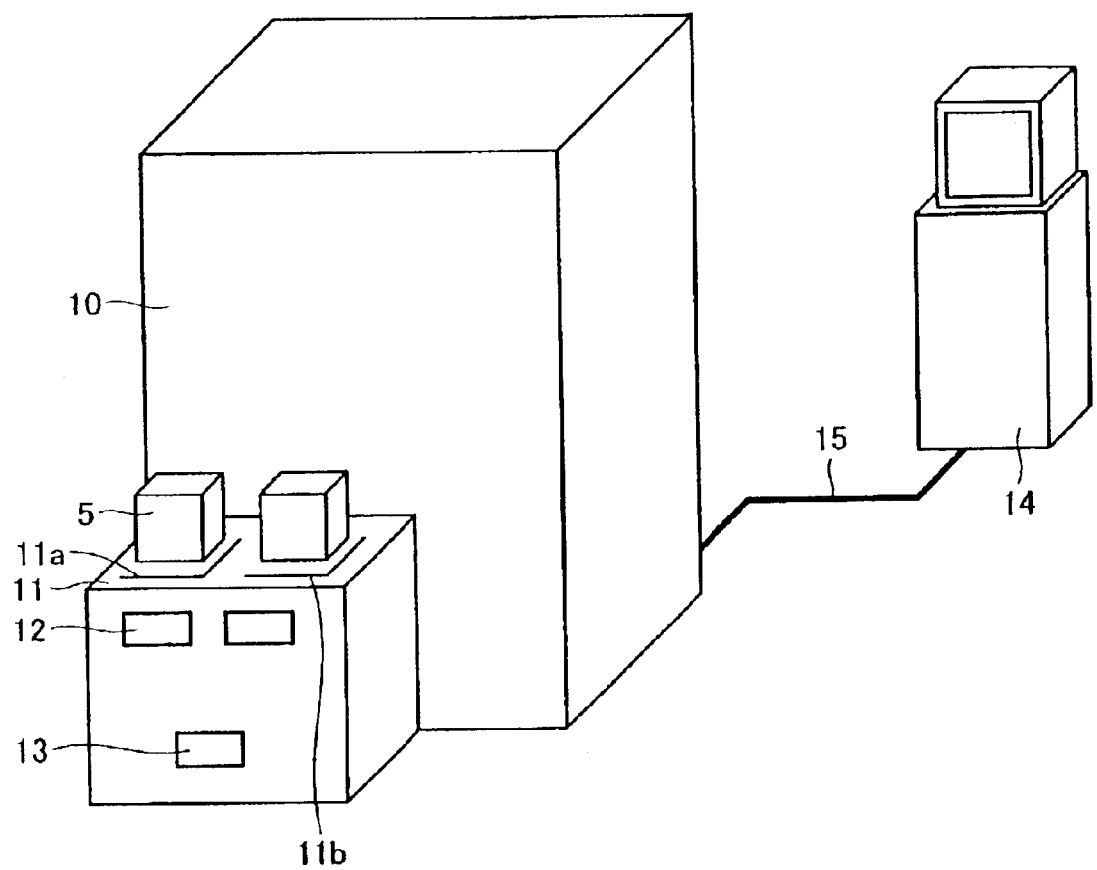
FIG. 5 is a perspective view showing a semiconductor manufacturing apparatus and a host computer provided in the semiconductor device manufacturing line in the same embodiment.

As shown in FIG. 5, semiconductor manufacturing apparatus 10 is provided with a load port 11 for receiving carrier 5. Semiconductor manufacturing apparatus 10 is provided with two load ports 110f a left load port 11a and a right load port 11b for successive processing.

A carrier ID reader 12 is attached to each load port 11. When receiving carrier 5, this carrier ID reader 12 reads carrier ID 6 to identify this carrier ID with an instruction from a host computer 14.

Semiconductor manufacturing apparatus 10 is also provided with an opening/closing mechanism (not shown) for opening and closing a carrier door 7 of carrier 5. Semiconductor manufacturing apparatus 10 is further provided with a carrier movement communication interface 13 and a control communication interface 15.

Carrier movement communication interface 13 indicates that carrier 5 is externally applied or ejected. Control communication interface 15 communicates information of processing semiconductor wafer 2 and the like with host computer 14.

In semiconductor manufacturing apparatus 10, carrier 5 sent from the previous step is placed on load port 11. Prescribed processing is performed on semiconductor wafer 2 removed from carrier 5, and that semiconductor wafer 2 which has undergone the processing is returned to the original carrier 5. The carrier accommodating the semiconductor wafer is sent to the next step. In this way, a series of operations is completed in semiconductor manufacturing apparatus 10.

A wafer transport apparatus is also arranged in the semiconductor device manufacturing line. It is noted that in this semiconductor device manufacturing line a part of the wafer transport apparatus is arranged as a hybrid stocker incorporated in the stocker as described later.

The wafer transport apparatus is classified as a type of semiconductor manufacturing apparatus 10. In the wafer transport apparatus, a wafer ID 3 of semiconductor wafer 2 is read and this wafer ID is identified with the instruction of the host computer. Thereafter semiconductor wafer 2 is returned to the original carrier 5.

In the wafer transport apparatus, semiconductor wafer 2 is also transported into a different carrier 5. More specifically, semiconductor wafer 2 that is accommodated in a filled carrier placed on one load port is taken out and wafer ID 3 there of is read for identification of semiconductor wafer 2. Thereafter, that semiconductor wafer is accommodated in an empty carrier placed on the other load port. This operation is also reversed.

Figure 6:
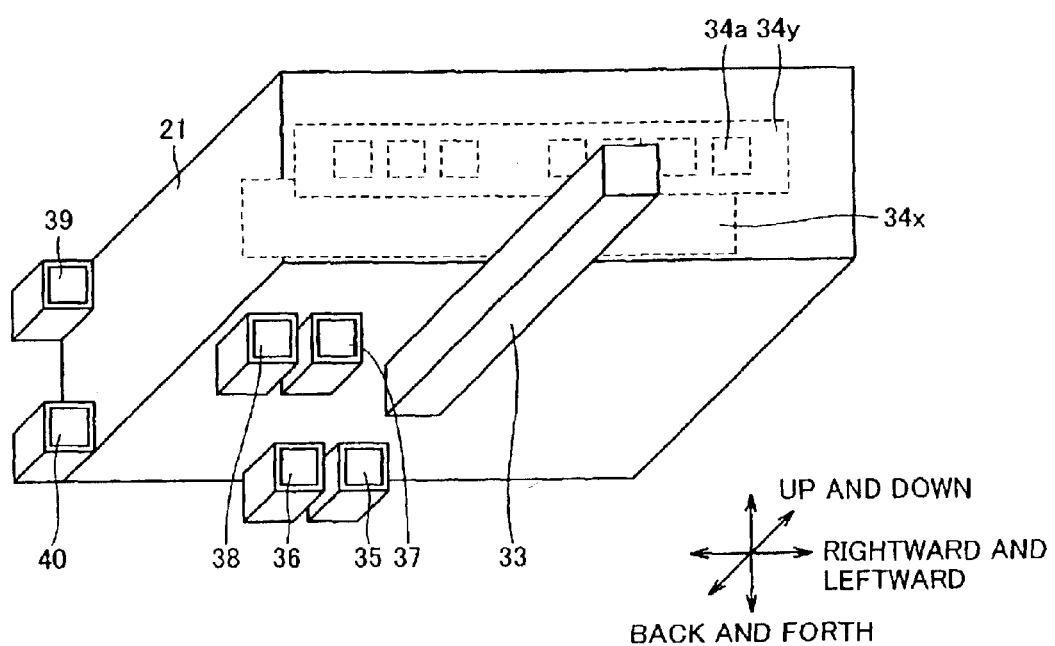
FIG. 6 is a perspective view showing a stocker provided in the semiconductor device manufacturing line in the same embodiment.

Stocker 21 will now be described. As shown in FIG. 6, stocker 21 includes a crane 33, a shelf 34, a manual application port 35, a manual ejection port 36, an inter-bay application port 37, an inter-bay ejection port 38, an intra-bay application port 39, and an intra-bay application port 40.

Crane 33 can move up and down, rightward and leftward, and back and forth while catching handling flange 9 of carrier 5. Shelf 34 is provided with a plurality of shelf locations 34a provided on the right, left, upper and lower sides of crane 33 for positioning carrier 5.

Manual application port 35 serves as an opening for the operator to apply a carrier. Manual ejection port 36 serves as an opening for ejecting a carrier to the operator. Inter-bay application port 37 serves as an opening for applying a carrier from inter-bay transfer apparatus.

Inter-bay ejection port 38 serves an opening for applying a carrier to inter-bay transfer apparatus 22. Intra-bay application port 39 serves as an opening for applying a carrier from intra-bay transfer apparatus 20. Intra-bay ejection port 40 serves as an opening for ejecting a carrier to intra-bay transfer apparatus 20.

It is noted that FIG. 6 only shows shelves 34x and 34y which are arranged on two levels at one side of shelf 34 disposed at both sides of crane 33. Furthermore, although crane 33 has a hand and an arm holding a handling flange 9 of carrier 5, only the body is shown herein and the hand and the arm are not shown.

In this way, stocker 21 functions to store a certain amount of carriers 5 and to relay the carrier to intra-bay transfer apparatus 20, inter-bay transfer apparatus 22 and the operator.

The operations of semiconductor manufacturing apparatus 10, check apparatus 16, stocker 21, intra-bay transfer apparatus 20 and inter-bay transfer apparatus 22 in the semiconductor device manufacturing line are controlled by the host computer (not shown) and executed by a program built in the host computer in advance.

An exemplary operation method will now be described. As shown in FIG. 4, a wafer applying operation 23 is an operation method of applying semiconductor wafer 2 on which a semiconductor integrated circuit to the semiconductor device manufacturing line. A semiconductor wafer produced by an outside wafer maker is usually used.

A wafer manufacturing operation 24 is an operation method for substantially forming a semiconductor integrated circuit on a semiconductor wafer. Specifically, semiconductor manufacturing apparatus 10 performs prescribed processing and check apparatus 59 checks a semiconductor wafer which has undergone the processing. Stocker 21, intra-bay transfer apparatus 20 and inter-bay transfer apparatus 22 transfer the carrier accommodating the semiconductor wafer to semiconductor manufacturing apparatus 10 and check apparatus 29, and semiconductor integrated circuit 1 is formed on semiconductor wafer 2.

A wafer completing operation 25 is an operation method in which a series of operations for forming semiconductor integrated circuit 1 on semiconductor wafer 2 is completed in the semiconductor device manufacturing line and the semiconductor integrated circuit is fed to an assembly step for finishing as a product.

Wafer manufacturing operation 24 is specifically constituted with repeated basic operation 36 and special operation 27. As shown in the enlarged part of FIG. 4, the semiconductor wafer accommodated in the carrier through basic operation 26 is conveyed from semiconductor manufacturing apparatus 10 or check apparatus 59 in one step to semiconductor manufacturing apparatus 10 or check apparatus 59 in the next step via intra-bay transfer apparatus 20, stocker 21 and inter-bay transfer apparatus 22.

In other words, basic operation 26 is an operation method constituted with a step starting operation 28 and a step completing operation 29.

Special operation 27 includes a rework processing operation 30, a carrier exchanging operation 31, and non-product wafer operation 32. Rework processing operation 30 on the right side of FIG. 4 is an operation method in which rework processing is performed on a product wafer determined as being failed in check apparatus 59.

Carrier exchanging operation 31 is an operation method in which carrier 5 is exchanged in a step in which semiconductor wafer 2 may be contaminated through carrier 5.

Non-product wafer operation 32 is an operation method in which non-product wafers are used respectively for checking the state of semiconductor manufacturing apparatus 10 and check apparatus 59 or for checking whether the processing by semiconductor manufacturing apparatus 10 is appropriate.

Wafer applying operation 23, step starting operation 28, step completing operation 29, and wafer completing operation 25 as described above will be described more specifically.

Figure 7:
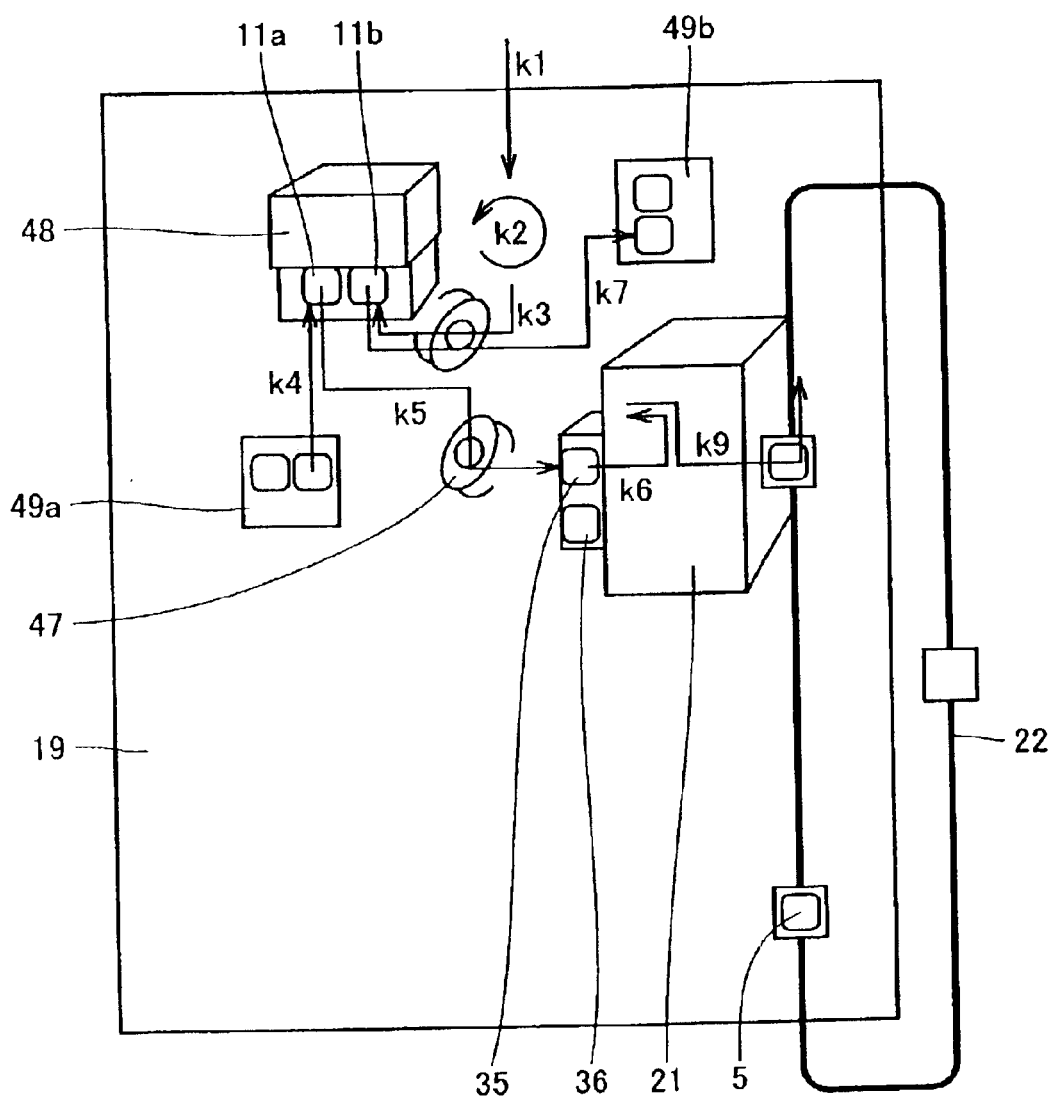
FIG. 7 illustrates a wafer applying operation in the semiconductor device manufacturing line in the same embodiment.

Wafer applying operation 23 is first described in detail with reference to FIG. 7. Wafer applying operation 23 is preformed in one bay 19. Stocker 21 provided in this bay 19 is connected to another bay 19 by inter-bay transfer apparatus 22. It is noted that this bay 19 is not provided with intra-bay transfer apparatus 20 and operator 47 performs the function thereof.

A product wafer for forming semiconductor integrated circuit 1 is accommodated in a prescribed carrier and transferred to bay 19 (operation k1), and wafer applying operation 23 is started. Application of a product wafer is reported to the host computer (not shown) through a terminal device (not shown) (operation k2).

The carrier accommodating that product wafer (filled carrier) is transferred to load port 11b of wafer transfer apparatus 48 (operation k3). An empty carrier stored in a manual rack 49b is transferred to load port 11a of wafer transport apparatus 48 (operation k4).

The product wafer accommodated in the filled carrier is then transported into the empty carrier by wafer transport apparatus 48 under the instruction of the host computer. After the completion of the transport opeartion, the empty carrier on load port 11b is ejected and temporarily stored in manual rack 49b (operation k7).

The filled carrier on load port 11a is removed and transferred to stocker 21 for transferring to manual application port 35 (operation k5). Under the instruction of the host computer, the filled carrier on manual application port 35 is once accommodated in stocker 21 (operation k6).

Based on the manufacturing standard information about the product wafer accommodated in the filled carrier, the host computer decides a semiconductor manufacturing apparatus in the next step. That filled carrier is then transferred to stocker 21 nearest to that semiconductor manufacturing apparatus by inter-bay transfer apparatus 22 (operation k9).

Wafer applying operation 23 is carried out by performing this series of operations on the product wafers externally applied for each carrier.

Figure 8:
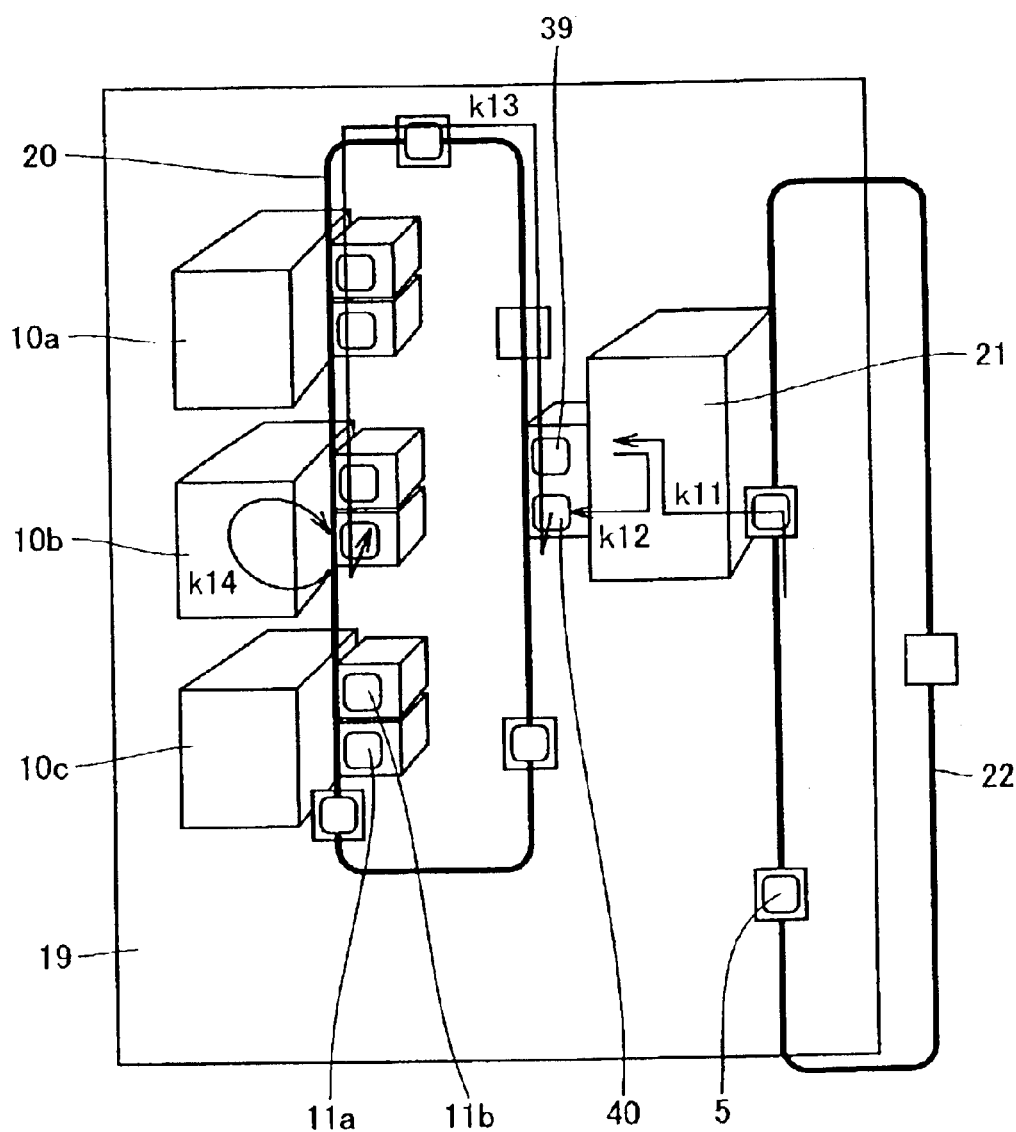
FIG. 8 illustrates a step starting operation in the semiconductor device manufacturing line in the same embodiment.

Step starting operation 28 will now be described in detail with reference to FIG. 8. Bay 19 is provided with three manufacturing apparatuses 10a–10c, intra-bay transfer apparatus 20, inter-bay transfer apparatus 22, and stocker 21. Stocker 21 is connected with intra-bay transfer apparatus 20 and inter-bay transfer apparatus 22.

The filled carrier accommodating a product wafer is transferred to bay 19 by inter-bay transfer apparatus 22 based on the manufacturing standard information. The transferred, filled carrier is once stored in stocker 21 (operation k11). In response to the demand from semiconductor manufacturing apparatus 10 (in this case manufacturing apparatus 10b) in the next step, the stored, filled carrier is ejected to intra-bay ejection port 40 (operation k12).

The filled carrier ejected to intra-bay ejection port 40 is transferred to load port 11 of semiconductor manufacturing apparatus 10b by intra-bay transfer apparatus 20 (operation k13). Then, carrier movement communication interface 13 detects that the filled carrier has been transferred to load port 11.

Reader 12 reads carrier ID 6 of the filled carrier to identify that carrier ID with the content of the instruction of the host computer. Based on the instruction of the host computer, semiconductor manufacturing apparatus 10b starts prescribed processing (operation k14).

Step starting operation 28 is carried out by performing this series of operations on the product wafers sent from the previous step for each carrier. It is noted that the operation similar to that of semiconductor manufacturing apparatus 10 is also performed in check apparatus 59 except rework processing operation 30 described later.

Figure 9:
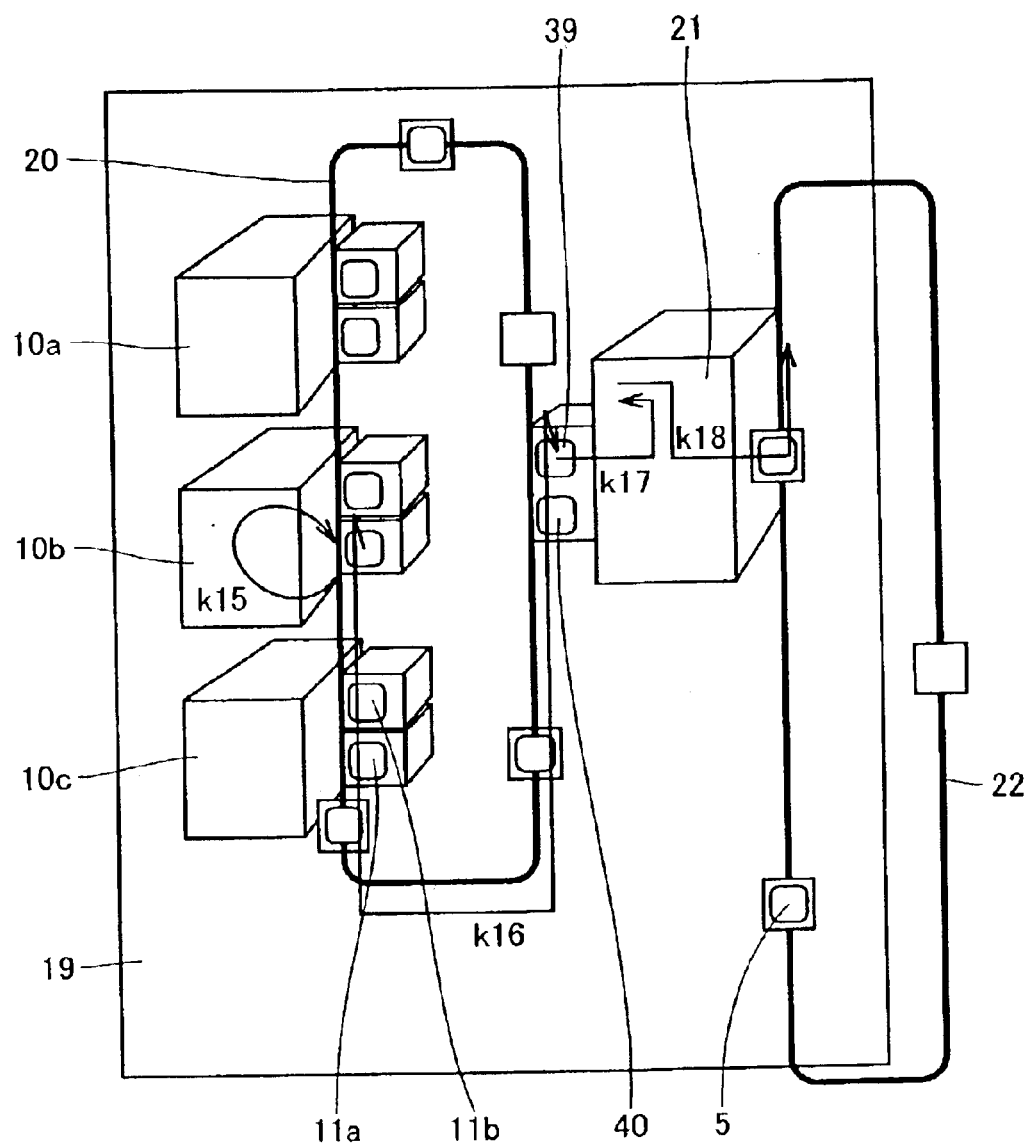
FIG. 9 illustrates a step completing operation in the semiconductor device manufacturing line in the same embodiment.

Step completing operation 29 will now be described in detail with reference to FIG. 9. Bay 19 is provided with three manufacturing apparatuses 10a–10c, intra-bay transfer apparatus 20, inter-bay transfer apparatus 22, and stocker 21. Stocker 21 is connected with intra-bay transfer apparatus 20 and inter-bay transfer apparatus 22.

First, semiconductor manufacturing apparatus 10b completes prescribed processing on a product wafer (operation k15). Based on the instruction of the host computer (not shown), intra-bay transfer apparatus 20 transfers the filled carrier from semiconductor manufacturing apparatus 10b to intra-bay application port 39 of the nearest stocker 21 (operation k16). The filled carrier transferred to intra-bay application port 39 is once accommodated in stocker 21 (operation k17).

Based on the manufacturing standard information about the product wafer accommodated in the filled carrier, the host computer decides a semiconductor manufacturing apparatus in the next step. That filled carrier is conveyed to stocker 21 nearest to that semiconductor manufacturing apparatus by inter-bay transfer apparatus 22 (operation k18).

Step completing operation 29 is carried out by performing for each carrier this series of operations on product wafers on which prescribed processing has been completed. When one step completing operation is completed, step starting operation 28 in the next step is started.

In this way, basic operation 26 is constituted with step starting operation 28 and step completing operation 29. Wafer manufacturing operation 24 is carried out by repeating this basic operation. It is noted that the operation similar to that of semiconductor manufacturing apparatus 10 is also performed in check apparatus 59 except rework processing operation 30 described later.

Figure 10:
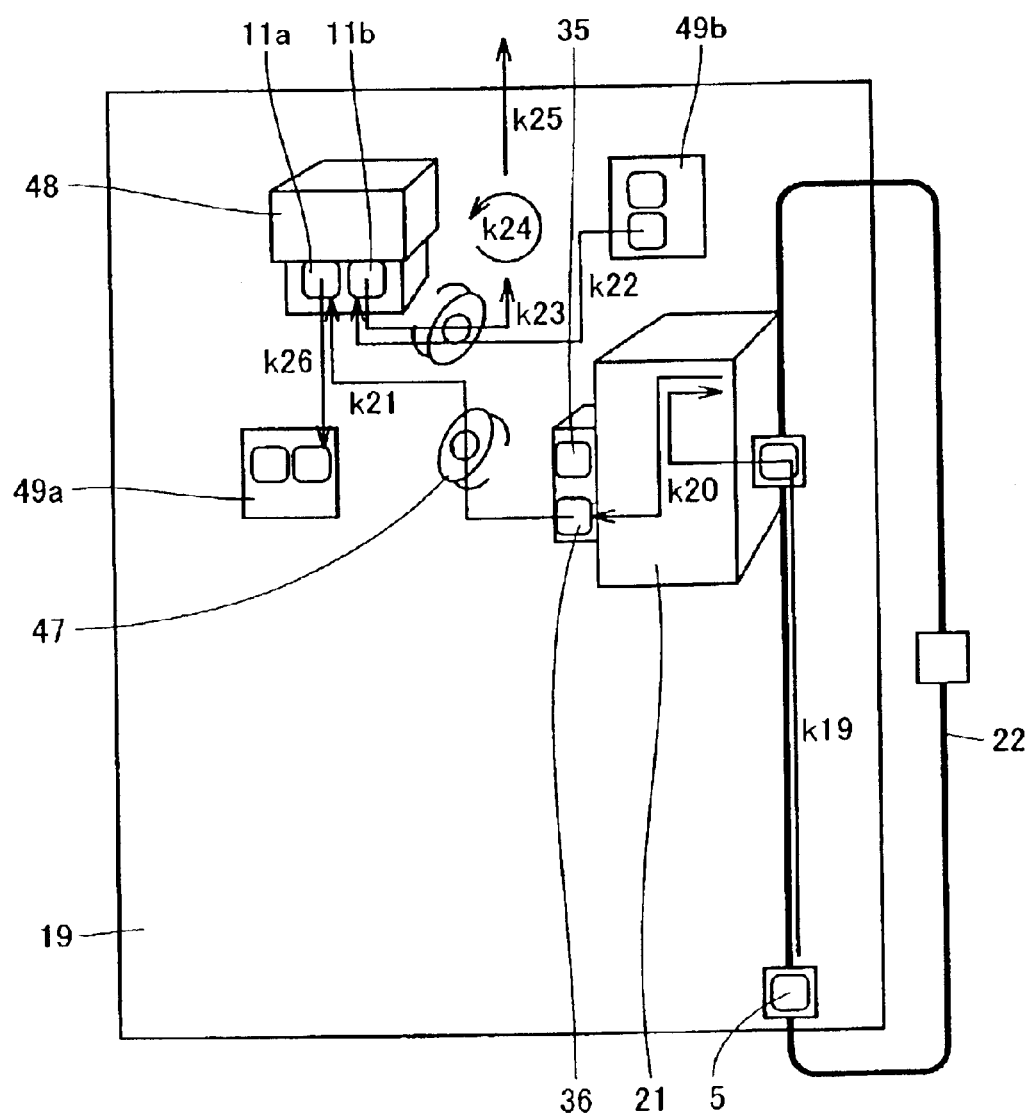
FIG. 10 illustrates a wafer completing operation in the semiconductor device manufacturing line in the same embodiment.

Wafer completing operation 25 will now be described in detail with reference to FIG. 10. Wafer completing operation 25 is performed in one bay 19. As shown in FIG. 10, stocker 21 provided in this bay 19 is connected to another bay 19 by inter-bay transfer apparatus 22. This bay 19 is not provided with intra-bay transfer apparatus 20 and operator 47 performs the function thereof.

First, a product wafer for which all the series of manufacturing steps has been completed is accommodated in a carrier (filled carrier) and transferred to this bay 19, and wafer completing operation 25 is started.

That filled carrier transferred to this bay 19 is once accommodated in stocker 21 (operation k19). Under the instruction of the host computer, the filled carrier is ejected to manual ejection port 36 (operation k20).

The filled carrier ejected to manual ejection port 36 is transferred to load port 11a of wafer transport apparatus 48 (operation k21). On the other hand, an empty carrier for external transfer, stored in manual rack 49b is transferred to load port 11b of wafer transport apparatus 48 (operation k22).

Then, under the instruction of the host computer, wafer transport apparatus 48 transports the product wafer accommodated in the filled carrier to the empty carrier. After the completion of the transport operation, the emptied carrier on load port 11a is ejected and that empty carrier is temporarily stored in manual rack 49a (operation k26).

The carrier into which the product wafer is transported is taken out now as a filled carrier (operation k23). That the filled carrier is externally shipped is reported to the host computer through the terminal (not shown) (operation k24). Finally, the filled carrier is packaged and shipped (operation k25).

Wafer completing operation 25 is carried out by performing for each carrier this series of operations on product wafers for which prescribed processing and check processing thereof have been completed in the semiconductor device manufacturing line. In this way, all the manufacturing steps in the semiconductor device manufacturing line are completed.

As described above, the substantial processing performed for forming a semiconductor device on a semiconductor wafer applied into the semiconductor device manufacturing line is carried out through the wafer manufacturing operation. No problem arises as long as the semiconductor manufacturing apparatus performs the processing on a semiconductor wafer appropriately.

When the check apparatus reveals that the processing is not performed appropriately, however, rework processing operation 30 of special operation 27 in the wafer manufacturing operation will be carried out.

In the first embodiment, the rework processing operation will be described specifically.

Furthermore, as described above, the operation of transporting a semiconductor wafer accommodated in a carrier is performed for example after a semiconductor manufacturing apparatus in each step performs prescribed processing. The carrier emptied by transporting the semiconductor wafer will be cleaned by a cleaning apparatus.

In this case, carrier exchanging operation 31 of special operation 27 in the wafer manufacturing operation is carried out. In the second embodiment, carrier exchanging operation 31 will be described specifically.

First Embodiment

Figure 11:
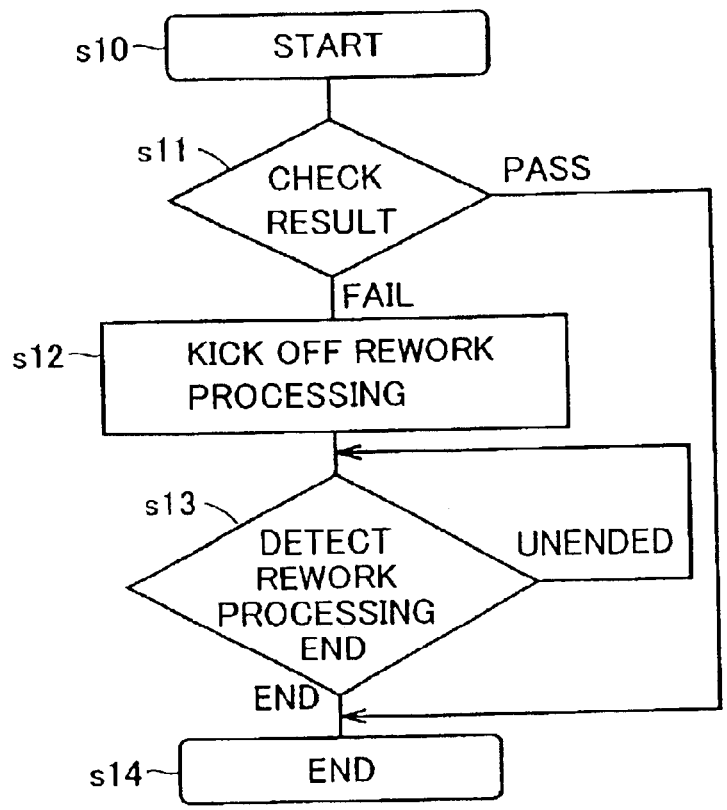
FIG. 11 is a first flow chart illustrating rework processing in the semiconductor device manufacturing line in the same embodiment.
Figure 12:
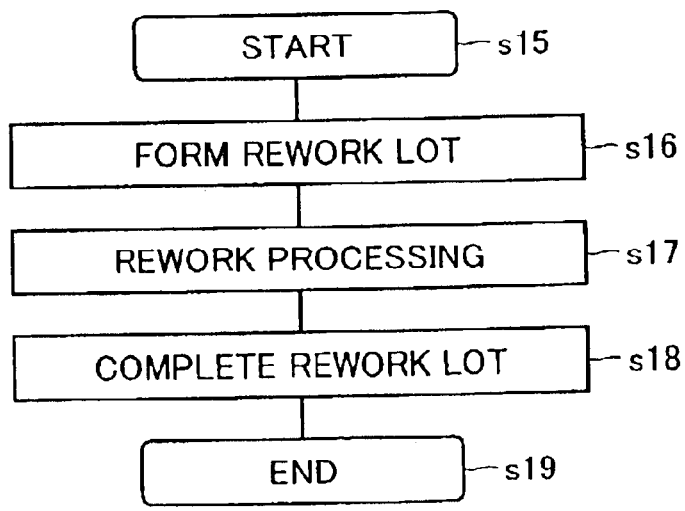
FIG. 12 is a second flow chart illustrating rework processing in the semiconductor device manufacturing line in the same embodiment.

The processing based on rework operation 30 by the host computer is divided into parent lot processing and rework lot processing as shown in FIGS. 11 and 12. A parent lot refers to a set of plurality of product wafers that is formed in wafer applying operation 23 and accommodated in one carrier.

A rework wafer refers to a set of product wafers that are determined as being failed based on the check result of check apparatus 59, separated from the parent lot and accommodated in a carrier. It is noted that this separation is made outside check apparatus 59. In this case, the separation of the product wafer is made in a hybrid stocker as described later.

First, as shown in FIG. 11, the processing for the parent lot is started with the start of the check of the processing which has been completed in semiconductor manufacturing apparatus 10 (step s10). In this check, the check result for each semiconductor wafer 1 is sent from check apparatus 59 to the host computer for storage.

Then, a determination of the check result for the parent lot is made (step s11). If all the product wafers are determined as being passed, all the product wafers in the parent lot are returned to the original carrier, and a series of processing is completed (step s14).

On the other hand, if it is determined that even a single product wafer is failed in steps s11, the rework processing is started after all the product wafers are returned to the original carrier (step s12). Then, after the rework lot processing is completed (step s13), a series of processing is completed (step s14).

The flow of processing the rework lot will now be described. As shown in FIG. 12, when the rework lot processing is started (step s15), a product wafer determined as being failed is picked out from the parent lot and is accommodated in a carrier different from the parent lot to form a rework lot (step s16).

The rework processing is performed on the product wafer in the rework lot by a corresponding semiconductor manufacturing apparatus 10 and the like (step s17). When all the rework processing is completed, the product wafer in the rework lot is transported to the carrier for the parent lot (step s18), and a series of processing is completed.

In the rework processing for example in a photolithography step, a photoresist pattern determined as being failed is removed and a photoresist pattern is newly formed on the product wafer.

In the rework processing for example when a film having a desired thickness is not formed in a film deposition step, a film corresponding to the remaining thickness is formed until the desired thickness is attained. On the other hand, in the rework processing when a film thicker than the desired thickness is formed, a prescribed etching apparatus performs etching to the desired thickness.

In the rework processing for example when a desired etching shape does not result in a process step, additional etching processing is performed until the desired etching shape is attained.

In the rework processing of the film deposition step or the process step, a plurality of rework lots may be formed in step s16, corresponding to a degree of deviation from a prescribed standard of thickness and shape. In this way, the respective optimum rework processing can be performed on the product wafers determined as being failed.

If the film formed in the film deposition step falls short of a desired thickness, rework lots are formed corresponding to the required thicknesses. For each rework lot, a film having a thickness corresponding to the required thickness is formed until the desired thickness is attained.

In this way, a plurality of rework lots are formed depending on the content of the product wafer determined as being failed, and the respective rework processing is performed on these rework lots, so that it is ensured that the product wafer determined as being failed can be recovered.

In this way, the processing based on the rework processing operation of the failed product wafer is performed. The rework processing operation will be further described in detail.

Figure 13:
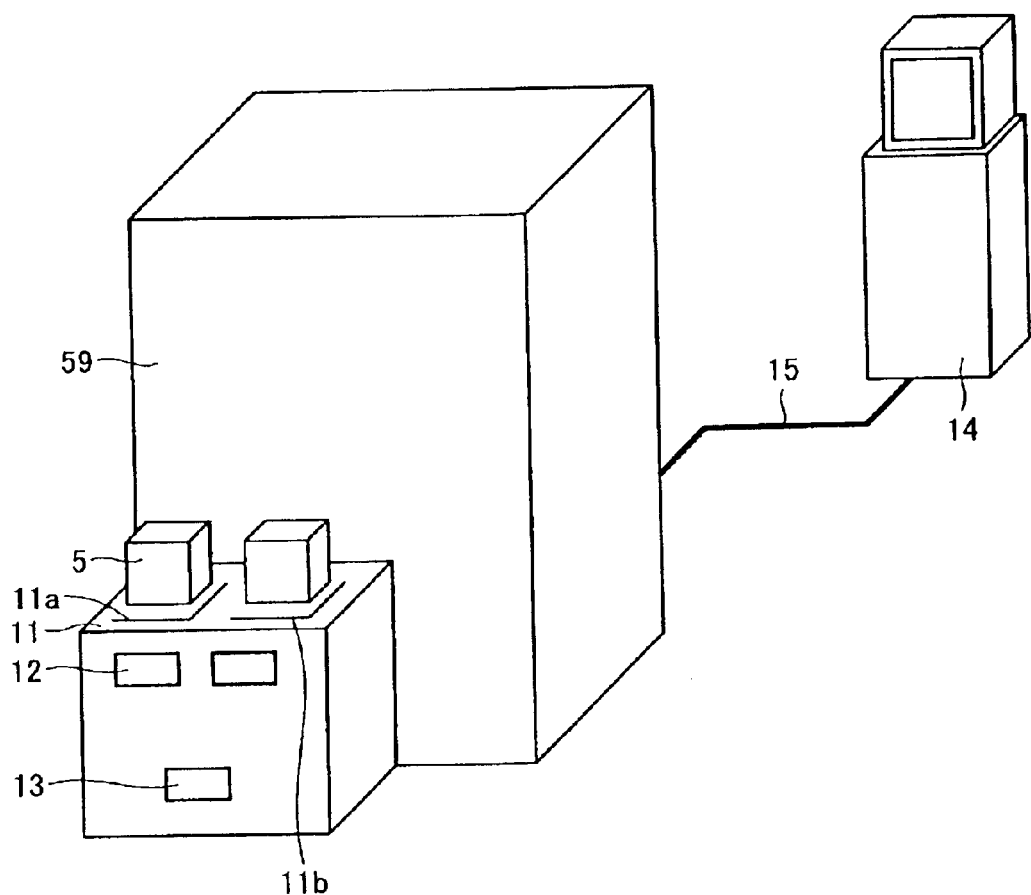
FIG. 13 is a perspective view showing a check apparatus and the host computer provided in the semiconductor device manufacturing line in the same embodiment.

First, check apparatus 59 for checking a product wafer will be described. As shown in FIG. 13, the present check apparatus 59 is not provided with a failure load port, unlike the conventional check apparatus 116.

Check apparatus 59 is provided with control communication interface 15 to send a check result for each product wafer to host computer 14. Host computer 14 has storage means for storing the check result sent from check apparatus 59.

Figure 14:
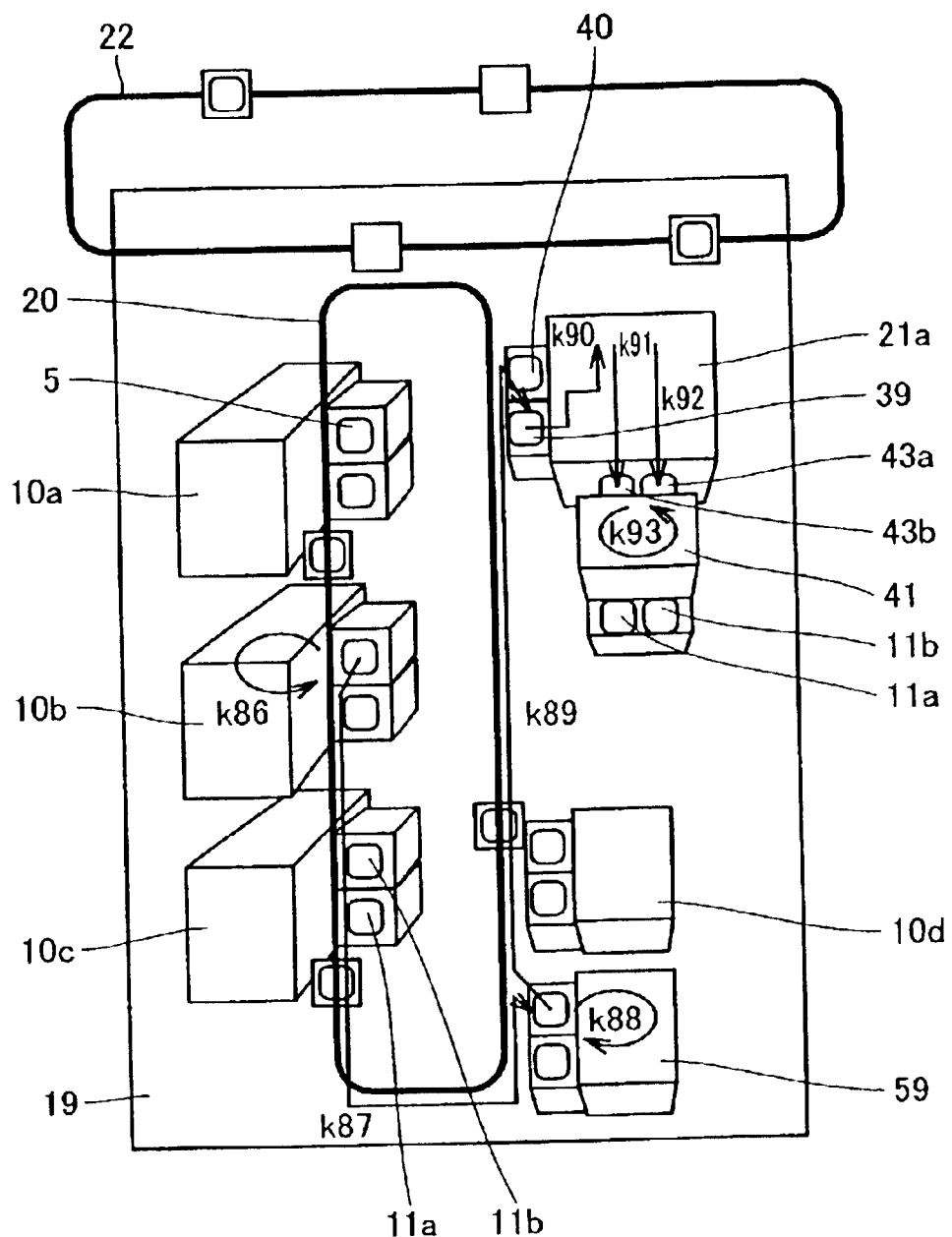
FIG. 14 is a first plan view illustrating a rework processing operation in the semiconductor device manufacturing line in the same embodiment.

As shown in FIG. 14, bay 19 is provided with four semiconductor manufacturing apparatuses 10a–10d, a built-in type wafer transport apparatus 41, a hybrid stocker 21a, an intra-bay transfer apparatus 20, and an inter-bay transfer apparatus 22. Hybrid stocker 21a is connected to a hybrid stocker 21 in another bay 19 by inter-bay transfer apparatus 22. Hybrid stocker 21a is paired with the built-in type wafer transport apparatus 41 so that the stocker function and the transport function are integrated.

A filled carrier accommodating a product wafer for which processing is completed by a prescribed semiconductor manufacturing apparatus 10b (operation k86) is transferred from load port 11 of semiconductor manufacturing apparatus 10b to load port 11 of check apparatus 59 (operation k87).

The production wafer accommodated in the filled carrier transferred to check apparatus 59 is checked one by one, and the check result is sent to the host computer. All of the product wafers for which check is completed are returned to the original filled carrier (operation k88).

After the checks are completed for all of the product wafers, the filled carrier is transferred from load port 11 of check apparatus 59 to intra-bay application port 39 of hybrid stocker 21a (operation k89). The filled carrier transferred to intra-bay application port 39 is accommodated in hybrid stocker 21a (operation k90).

As a result of the check, if there is any product wafer 2a determined as being failed, the filled carrier once accommodated is placed from shelf 34 to crane load port 43b of built-in type wafer transport apparatus 41 by crane 33, in order to form a rework lot (operation k91).

An empty carrier stored in hybrid stocker 21a in advance is placed from shelf 34 to crane load port 43a by crane 33 (operation k92).

That product wafer of the product wafers accommodated in the filled carrier which is determined as being failed is transported into the empty carrier by built-in type wafer transport apparatus 41 under the instruction of the host computer (operation k93).

Figure 15:
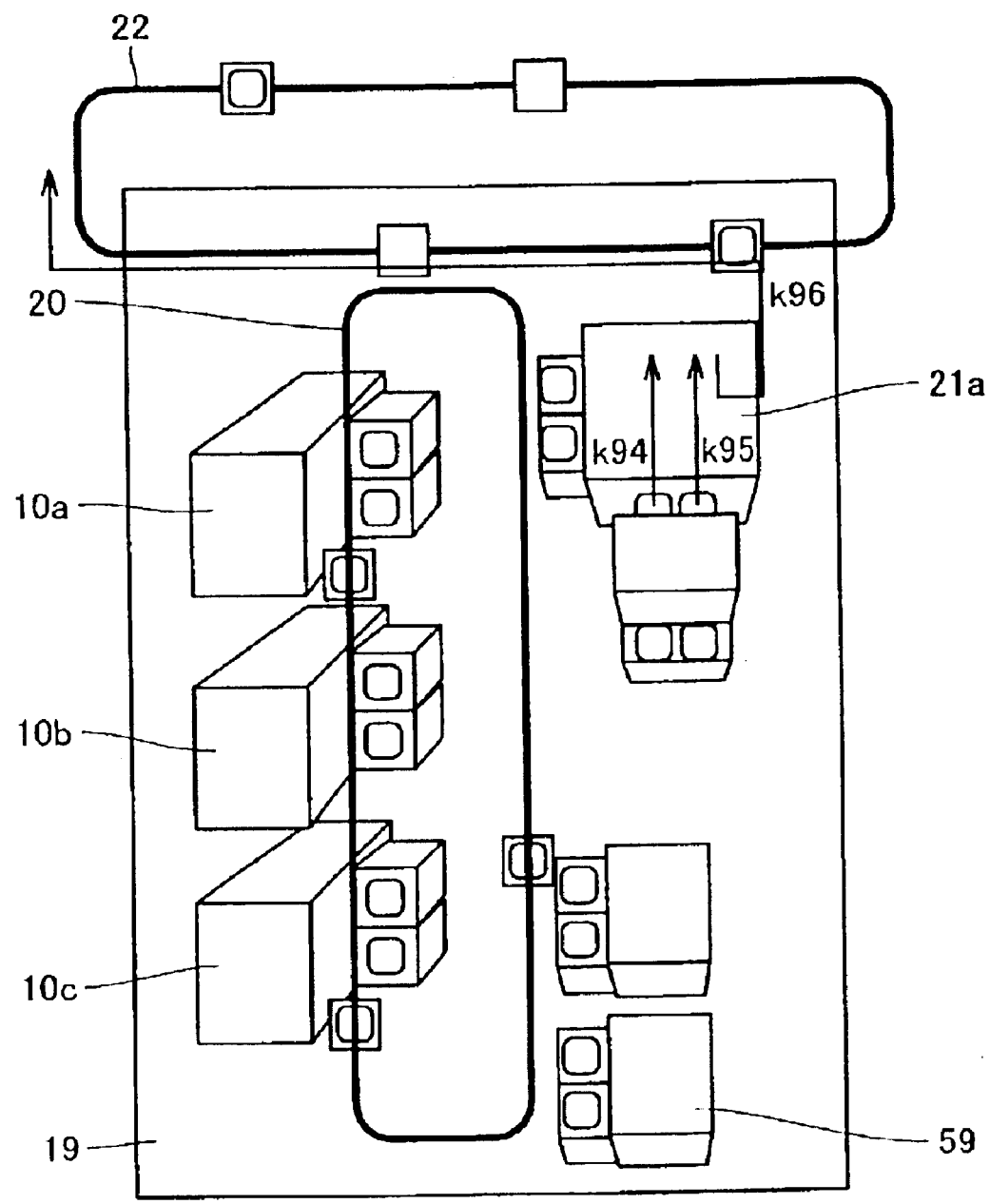
FIG. 15 is a second plan view illustrating the rework processing operation in the semiconductor device manufacturing line in the same embodiment.

Then, as shown in FIG. 15, after the completion of the transport operation, the filled carrier (parent lot) from which the product wafer determined as being failed is picked out is once accommodated in stocker 21a (operation k94).

On the other hand, the carrier in which only the product wafer determined as being failed is accommodated is also once stored in stocker 21a (operation k95). The carrier accommodating the product wafer determined as being failed by the check apparatus is regarded as a rework lot by the host computer.

At this point, a plurality of rework lots corresponding to the degreed of rework processing may be formed by repeating operation k91 to operation k95 described above depending on the content of the check result.

The rework lot thus formed is subjected to the rework processing through wafer manufacturing operation 24 in accordance with the manufacturing standard information for rework, held by the host computer. In the case where a plurality of rework lots are formed, optimum rework processing is performed on the product wafer depending on the degree of rework processing.

As shown in FIG. 15, the filled carrier regarded as the rework lot is transferred to the nearest stocker 21 in a prescribed step by inter-bay transfer apparatus 22 (operation k96).

Figure 16:
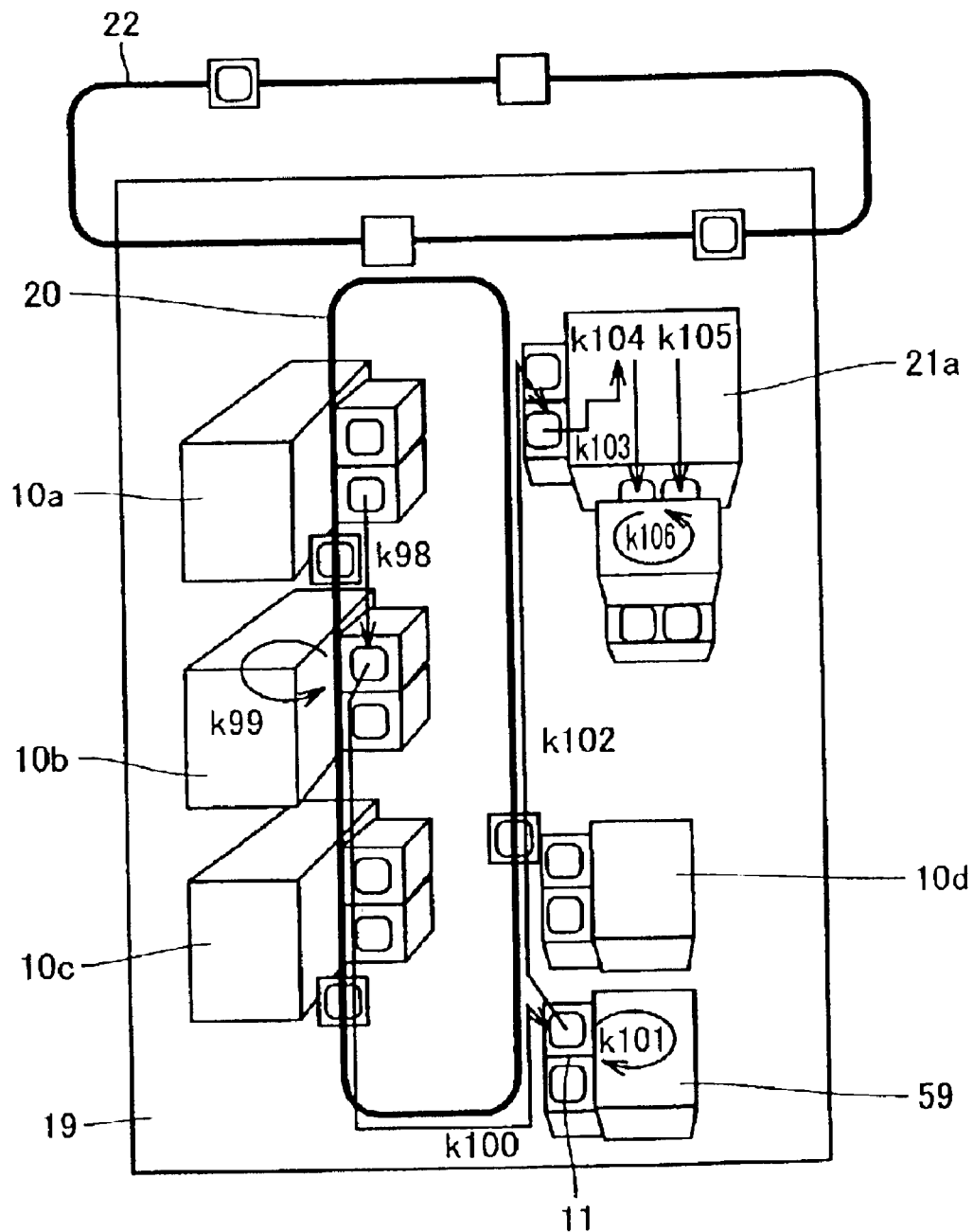
FIG. 16 is a third plan view illustrating the rework processing operation in the semiconductor device manufacturing line in the same embodiment.

Then, as shown in FIG. 16, the rework lot is transferred for example to prescribed semiconductor manufacturing apparatus 10b in the photolithography step (operation k98). Semiconductor manufacturing apparatus 10b newly performs prescribed processing on the product wafer (operation k99).

In the case of the product wafer determined as being failed in the photolithography step, for example, a photoresist pattern formed on the product wafer is first removed by a prescribed apparatus and a photoresist is newly applied on the product wafer for exposure by semiconductor manufacturing apparatus 10b.

If the film formed in the film deposition step falls short of a desired thickness, for example, respective films having thicknesses corresponding to the required thicknesses are formed for a plurality of rework lots formed corresponding to the required thicknesses, until the desired thicknesses are attained.

If the desired etching shapes do not result in the process step, for example, respective additional etching processings are performed for the plurality of rework lots formed depending on the shapes until desired shapes are attained.

The rework lot of which prescribed rework processing is completed by semiconductor manufacturing apparatus 10b is transferred from load port 11 of semiconductor manufacturing apparatus 10b to the load port 11 of check apparatus 59 (operation k100). The check processing is peformed on the product wafer in the rework lot transferred to check apparatus 59 (operation k101).

Then, after all the product wafers have been checked, the carrier of the rework lot is transferred from load port 11 of check apparatus 59 to intra-bay application port 39 of hybrid stocker 21a (operation k102). The carrier of the rework lot transferred to intra-bay application port 39 is accommodated in hybrid stocker 21a (operation k103).

In order to return the product wafer accommodated in the rework lot to the parent lot accommodated in hybrid stocker 21a, the carrier of the rework lot is placed from shelf 34 to crane load port 43b of built-in type wafer transport apparatus 41 by the crane 33 (operation k104).

On the other hand, the carrier of the parent lot is placed from shelf 34 to crane load port 43a by crane 33 (operation k105). The product wafer accommodated in the carrier of the rework lot, of which rework processing is completed, is transported into the carrier of the parent lot by built-in type wafer transport apparatus 41 under the instruction of the host computer (operation k106).

Figure 17:
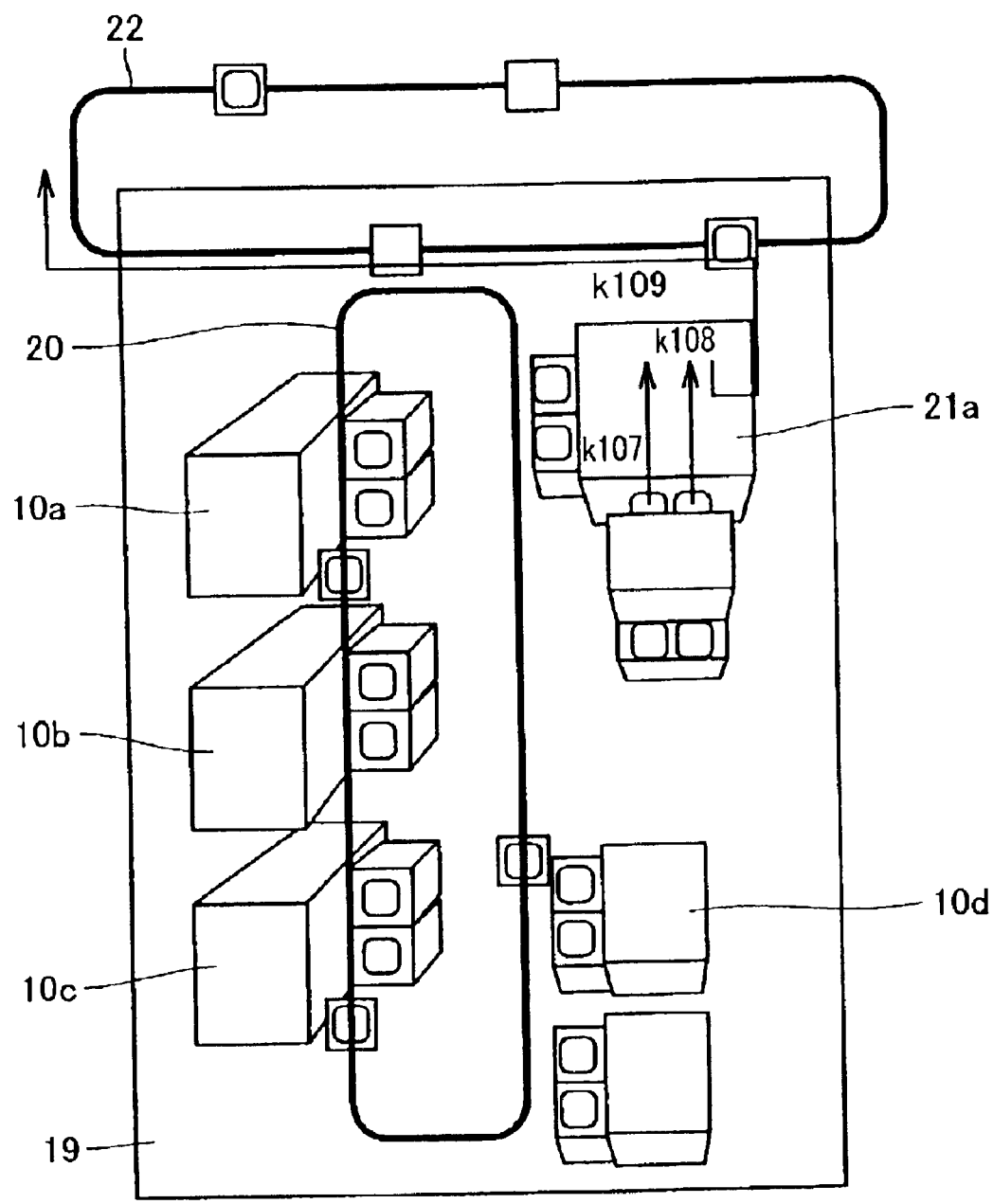
FIG. 17 is a fourth plan view illustrating the rework processing operation in the semiconductor device manufacturing line in the same embodiment.

Then, as shown in FIG. 17, after the operation of transporting the product wafer is completed, the carrier emptied on crane load port 43b is once accommodated in hybrid stocker 21a (operation k107). The carrier (filled carrier) of the parent lot accommodating the product wafer for which rework processing is completed is also once accommodated in hybrid stocker 21a (operation k108). Thus, a series of rework processing is completed.

It is note that operations k104 to k108 are repeatedly performed if a plurality of rework lots are formed depending on the degree of the rework processing. The filled carrier after the rework processing is completed is transferred to a bay in the next step by inter-bay transfer apparatus 22 based on the manufacturing standard information of the host computer (operation k109).

Also in this bay 19, step starting operation 28 as described above will be performed. In this way, a semiconductor integrated circuit is successively formed on a semiconductor wafer resulting in a semiconductor device.

In the rework processing operation described above, a determination result for each semiconductor wafer by check apparatus 59 is stored by the host computer, and the product wafers determined as being failed are accommodated in one or more carriers for automatically forming a rework lot.

In this way, the rework processing which was conventionally performed by an operator is automated, resulting in an efficient carrier transfer and optimum rework processing. In addition, the manufacturing period can be shortened.

In addition, in the test apparatus, the product wafer determined as being failed is accommodated in a prescribed carrier by built-in type wafer transport apparatus 41, so that a space for placing the carrier of the rework lot as in the conventional check apparatus 116 is no longer required. As a result, the serviceability of the check apparatus can be improved and the area occupied by the check apparatus can be decreased.

Second Embodiment

Carrier exchanging operation of special operation 27 in the wafer manufacturing operation will now be described based on a block diagram showing carrier state transitions held by the host computer.

Figure 18:
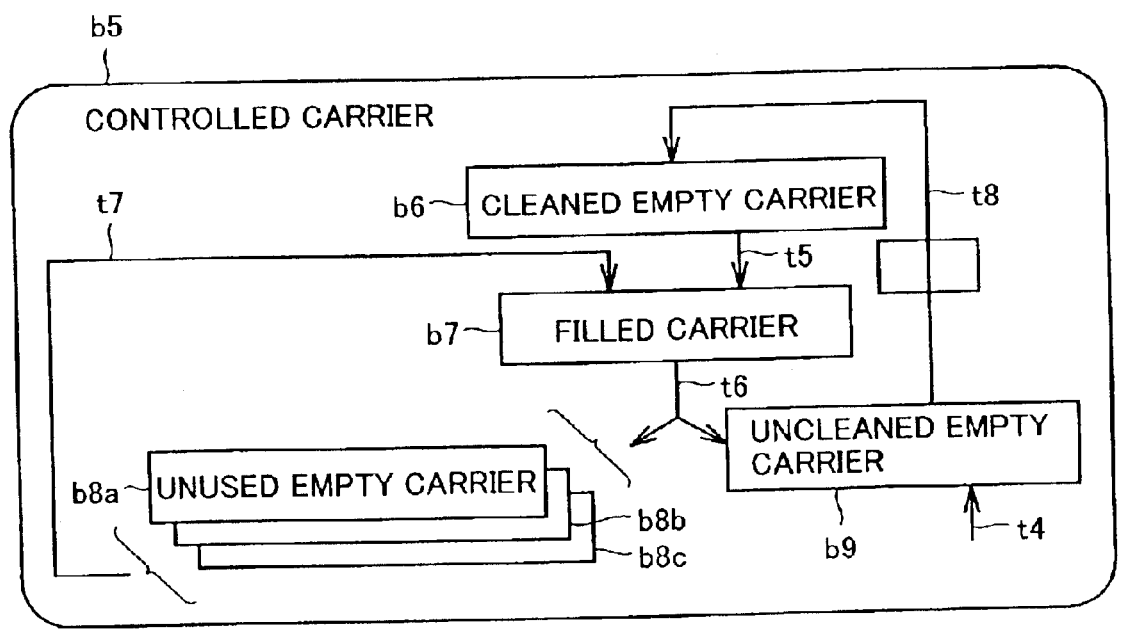
FIG. 18 is a block diagram showing the states of the carrier in the semiconductor device manufacturing line in a second embodiment.

As shown in FIG. 18, first, in order to use a carrier in the semiconductor device manufacturing line, each carrier is registered in the host computer and enters a controlled carrier state b5. The carrier in controlled carrier state b5 unconditionally enters an uncleaned empty carrier state b9 (state transition t4).

The carrier (empty carrier) in uncleaned empty carrier state b9 is cleaned under the control of the host computer by the carrier cleaning apparatus (not shown) and enters a cleaned carrier (empty carrier) state b6 (state transition t8).

Figure 19:
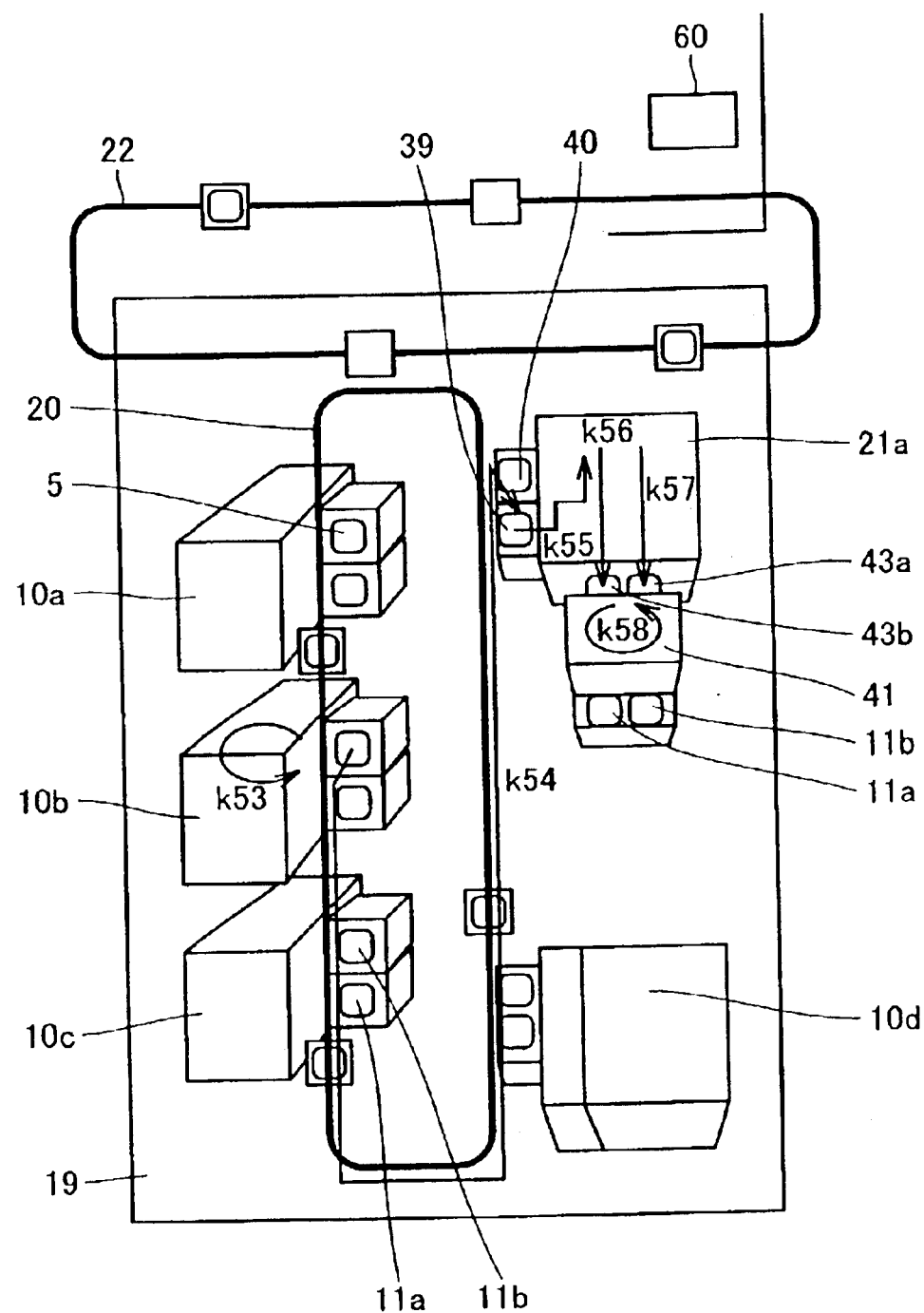
FIG. 19 is a first plan view illustrating a carrier exchanging operation in the semiconductor device manufacturing line in the same embodiment.

In carrier exchanging operation 31, before the empty carrier shown in FIG. 19 is transferred from shelf 34 of hybrid stocker 21a to crane load port 43a of built-in type wafer transport apparatus 41 (operation k57), an empty carrier to be exchanged is required, and a carrier suitable for a purpose of use in the step of manufacturing a product wafer to be transported is selected from the carriers in reusable empty carrier state b8.

The selected empty carrier is transferred from shelf 34 of hybrid stocker 21a to crane load port 43a of built-in type wafer transport apparatus 41 (operation k57). The transferred empty carrier is used in carrier exchanging operation 31.

When the product wafer 2 is accommodated in that carrier by built-in type wafer transport apparatus 41 (operation k58), the carrier enters a filled carrier state b7 (state transition t7).

If an empty carrier suitable for the purpose of use does not exist in the carriers in the reusable empty carrier state b8, a carrier in the cleaned, unused empty carrier state b6 is selected. Also in this case, similar to the case where a carrier in the reusable empty carrier state b8 is used, that carrier enters filled carrier state b7 (state transition t5).

When the carrier in the cleaned, unused empty carrier state b6 is selected and starts being used, the carrier history information such as the purpose of use the carrier, the elapsed time after cleaning, the number of times of use, and the like will be handled by the host computer.

Figure 20:
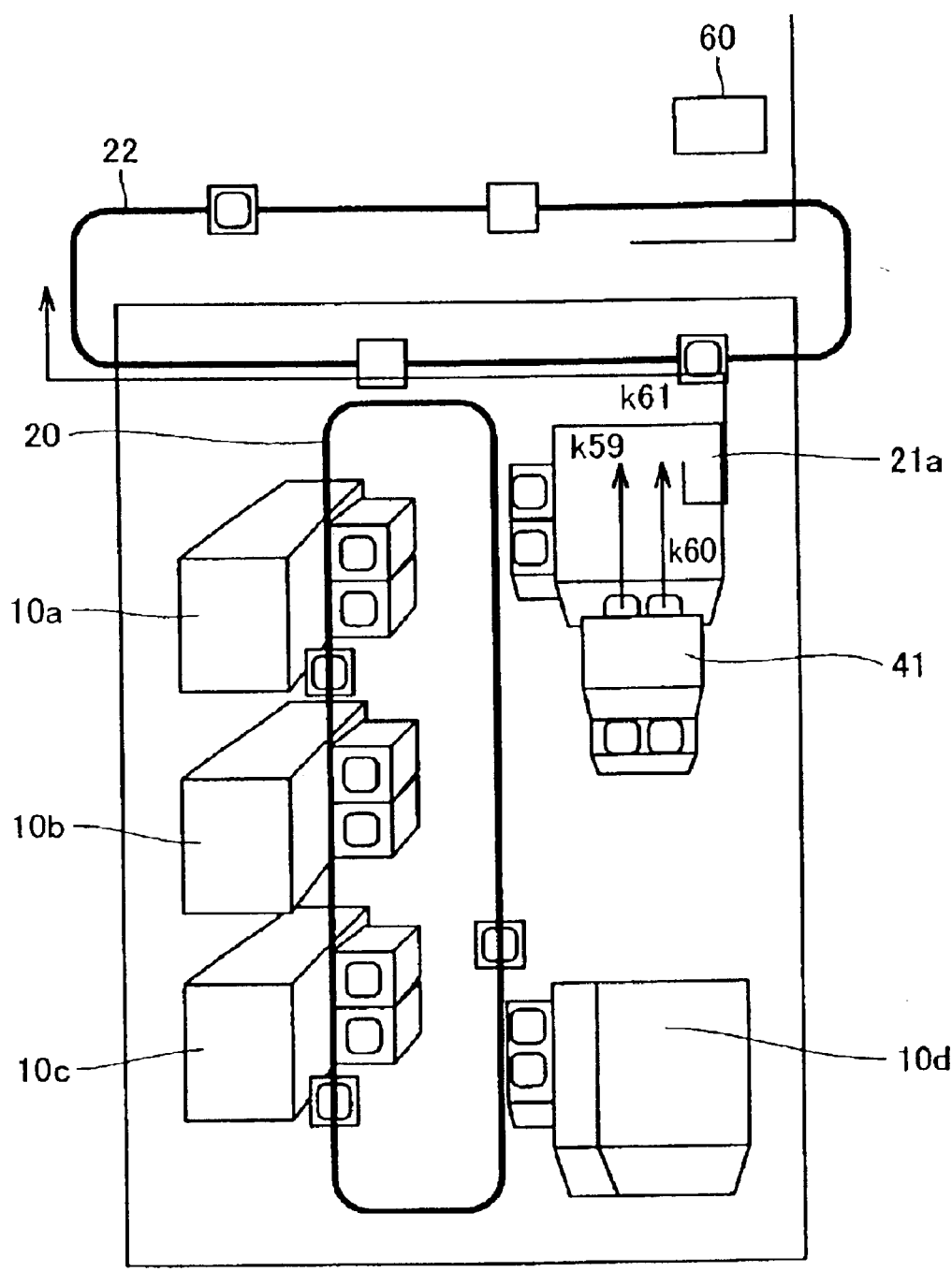
FIG. 20 is a second plan view illustrating the carrier exchanging operation in the semiconductor device manufacturing line in the same embodiment.
Figure 21:
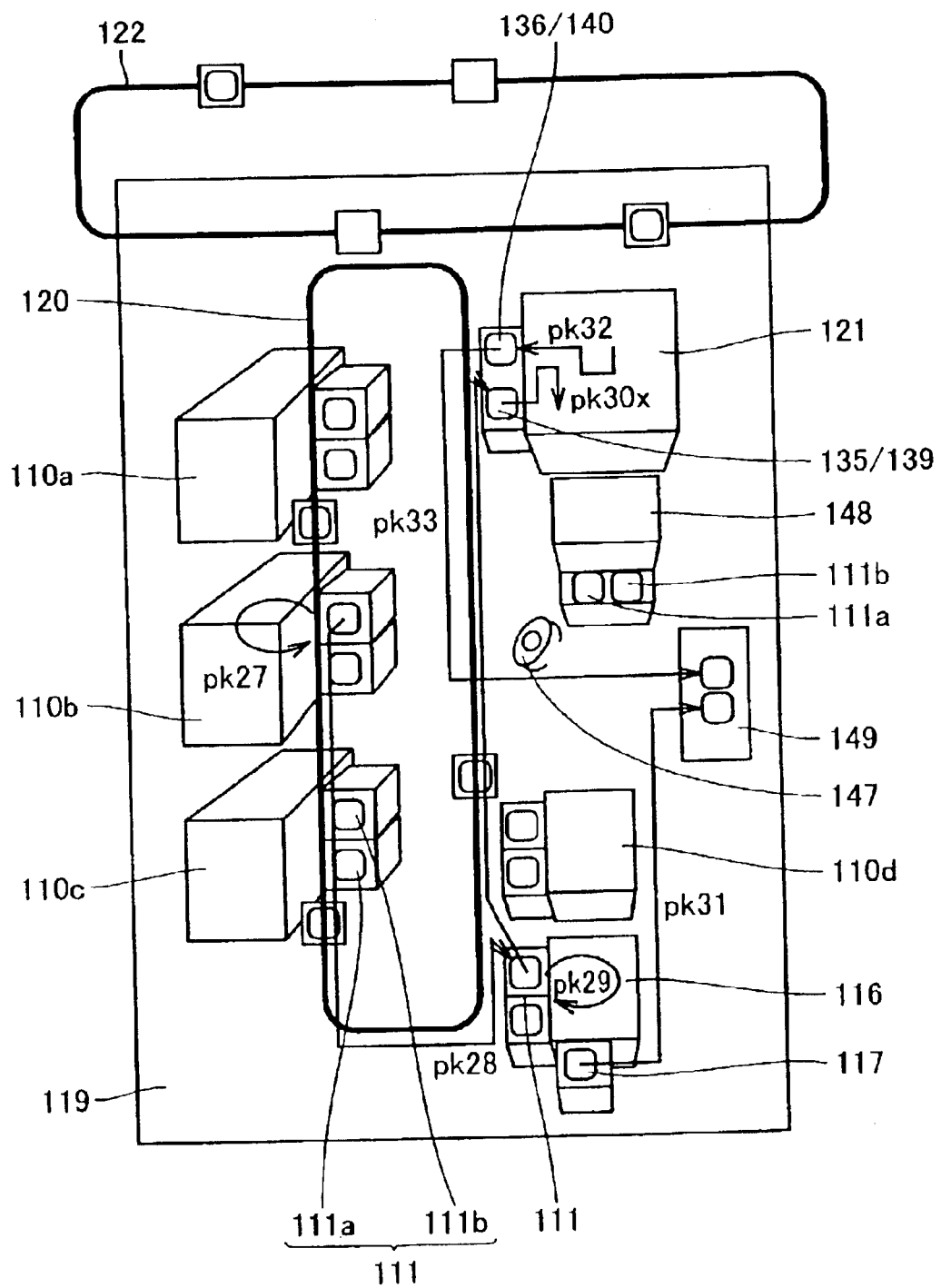
FIG. 21 is a plan view showing a conventional semiconductor device manufacturing line.
Figure 22:
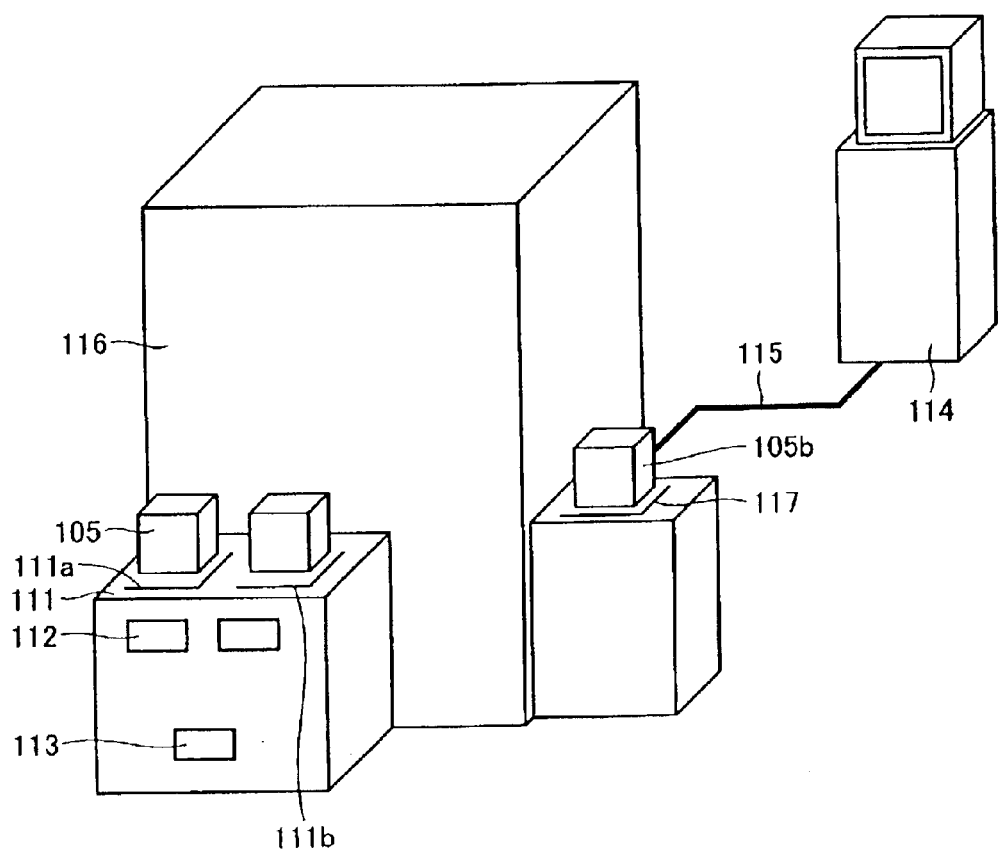
FIG. 22 is a perspective view showing a semiconductor manufacturing apparatus and a host computer provided in the conventional semiconductor device manufacturing line.
Figure 23:
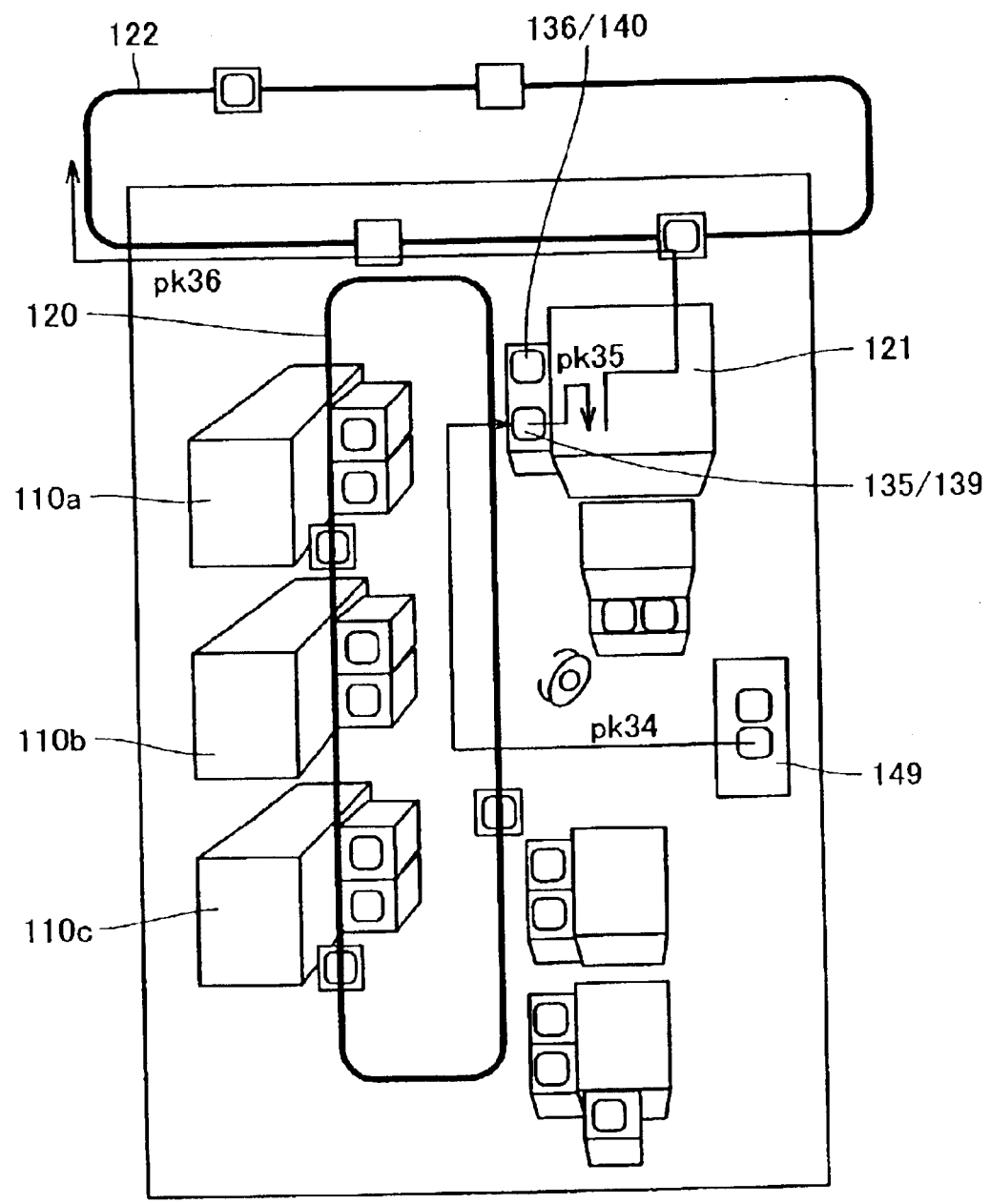
FIG. 23 is a first plan view illustrating a rework processing operation in the conventional semiconductor device manufacturing line.
Figure 24:
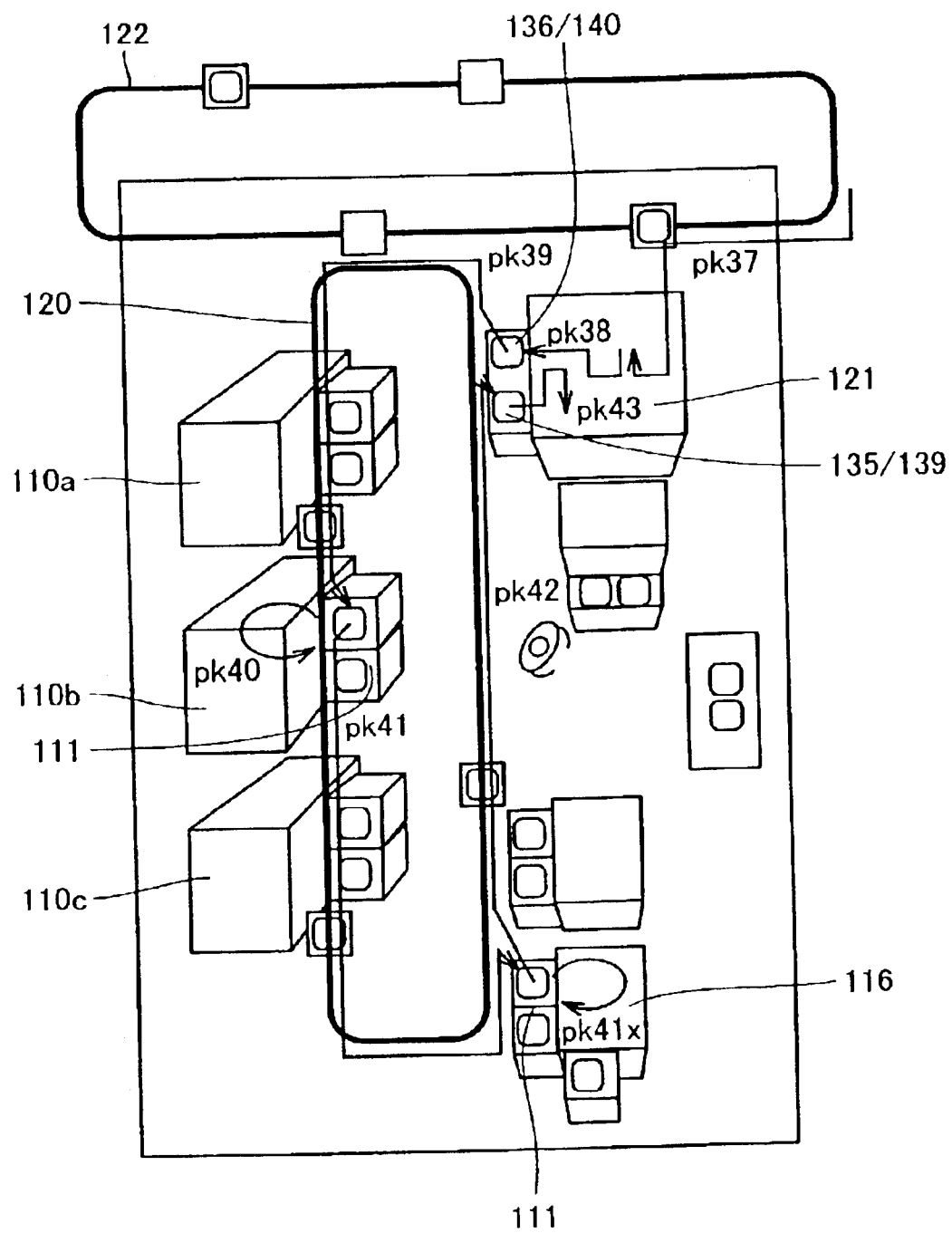
FIG. 24 is a second plan view illustrating the rework processing operation in the conventional semiconductor device manufacturing line.
Figure 25:
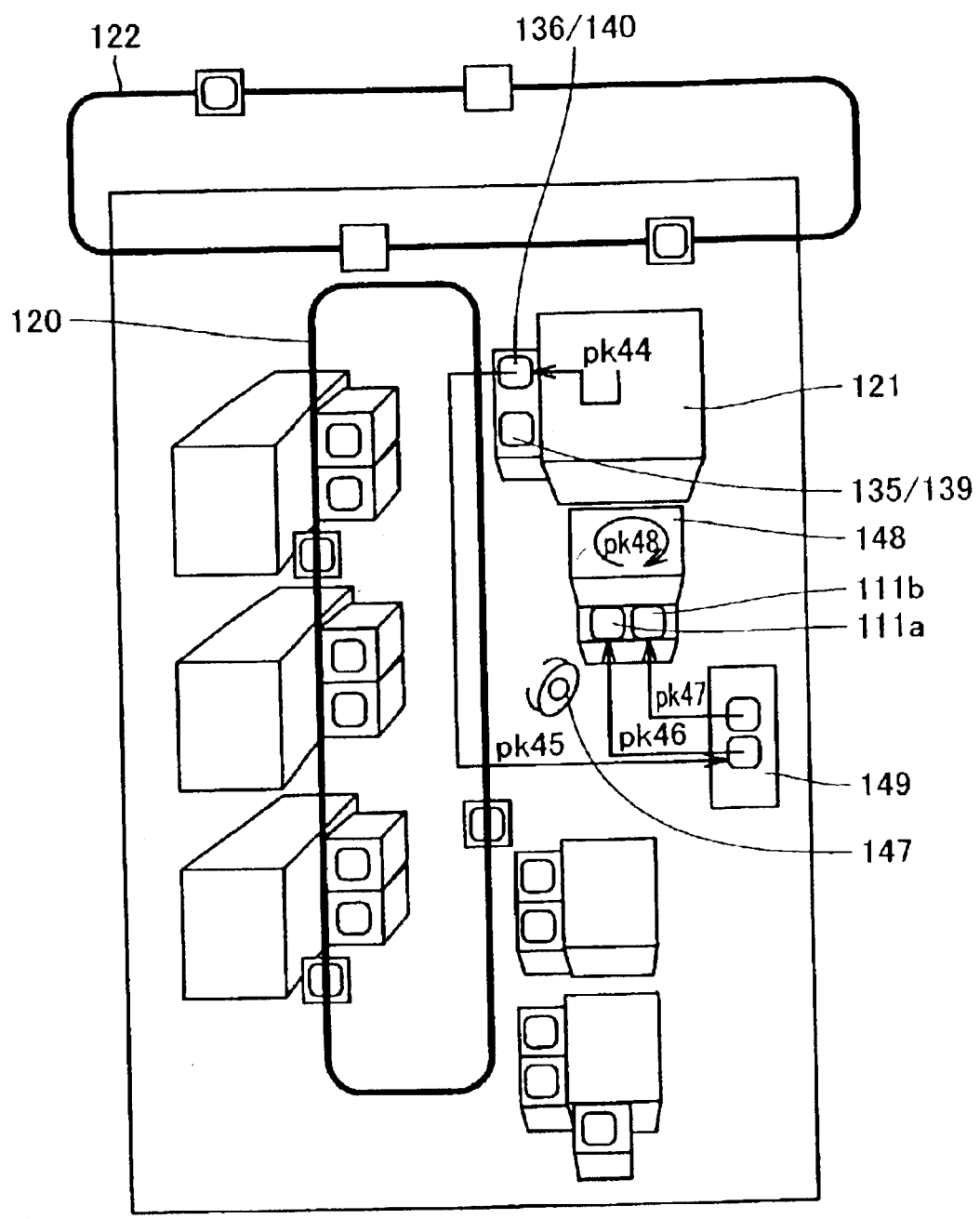
FIG. 25 is a third plan view illustrating the rework processing operation in the conventional semiconductor device manufacturing line.
Figure 26:
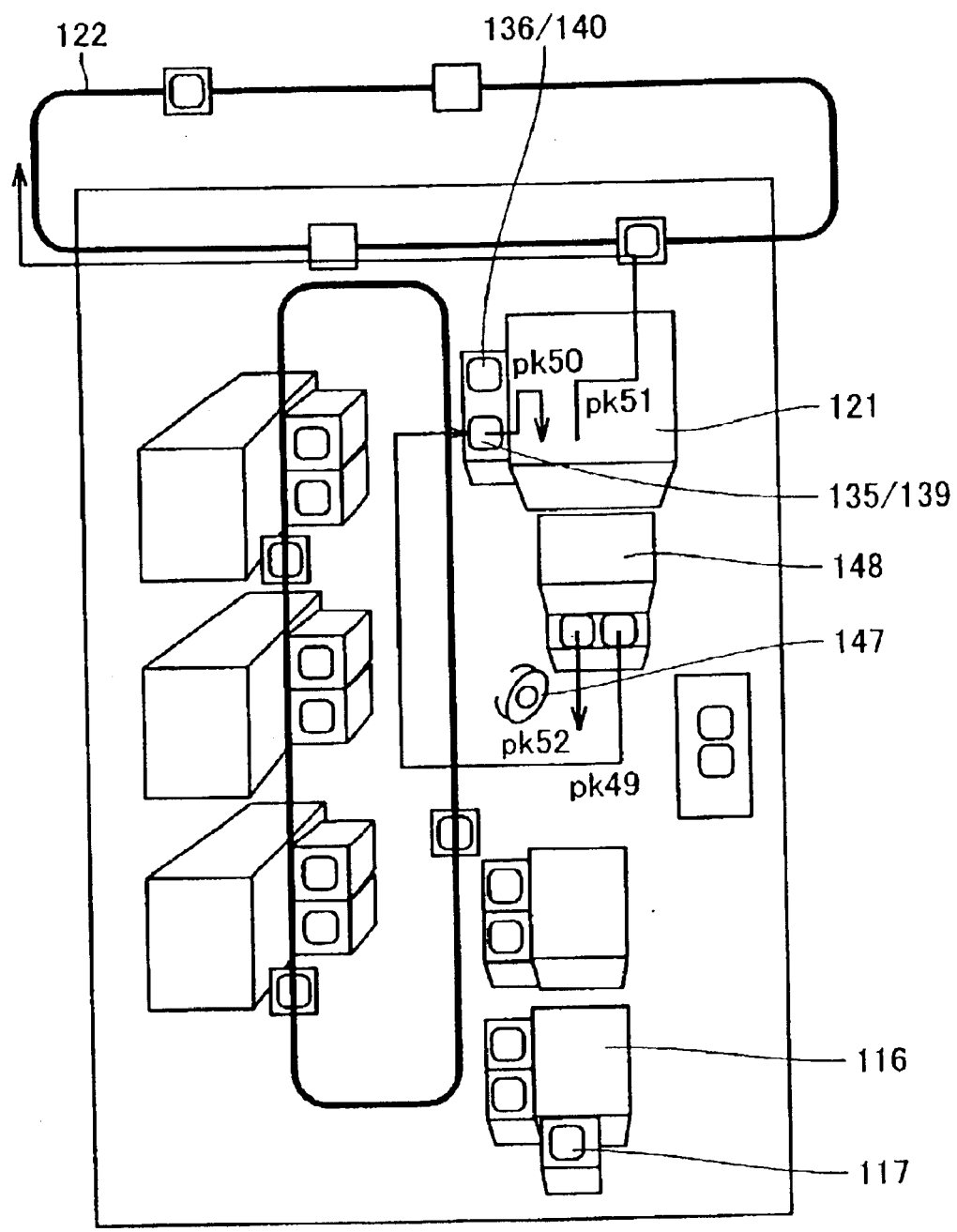
FIG. 26 is a fourth plan view illustrating the rework processing operation in the conventional semiconductor device manufacturing line.
Figure 27:
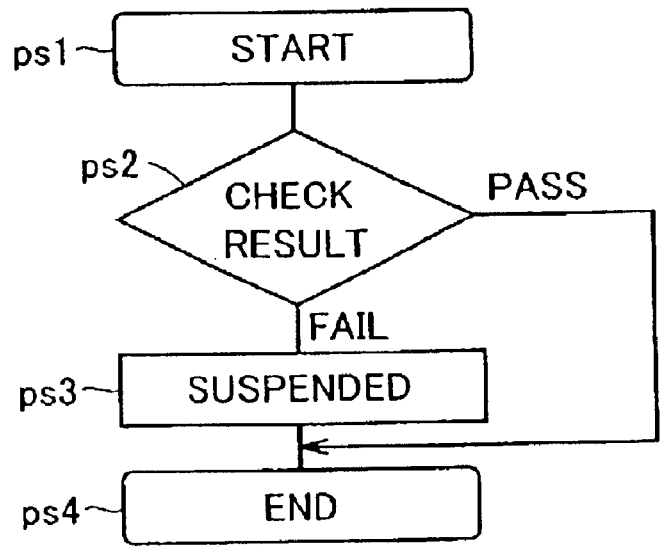
FIG. 27 is a first flow chart illustrating the rework processing in the conventional semiconductor device manufacturing line.
Figure 28:
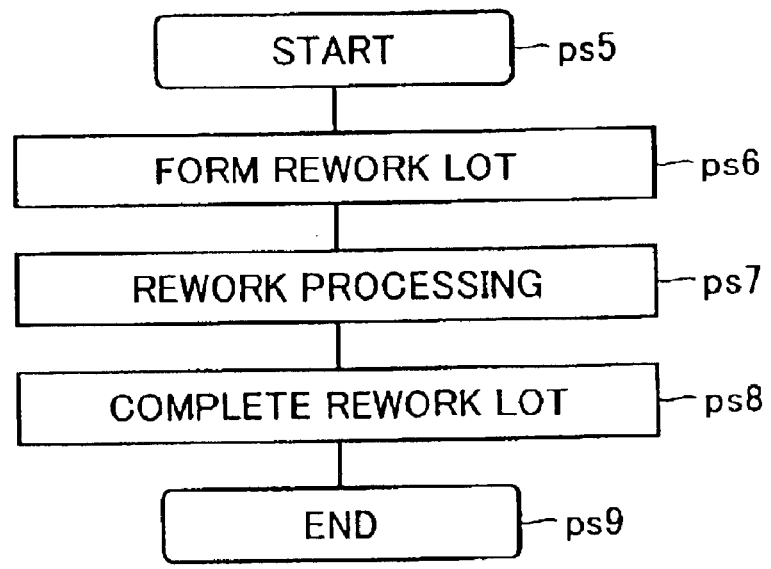
FIG. 28 is a second flow chart illustrating the rework processing in the conventional semiconductor device manufacturing line.
Figure 29:
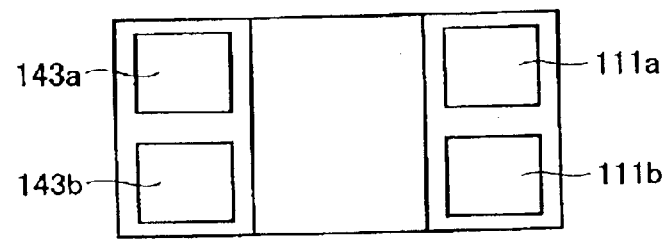
FIG. 29 is a partial plan view showing a hybrid stocker provided in the conventional semiconductor device manufacturing line.
Figure 30:
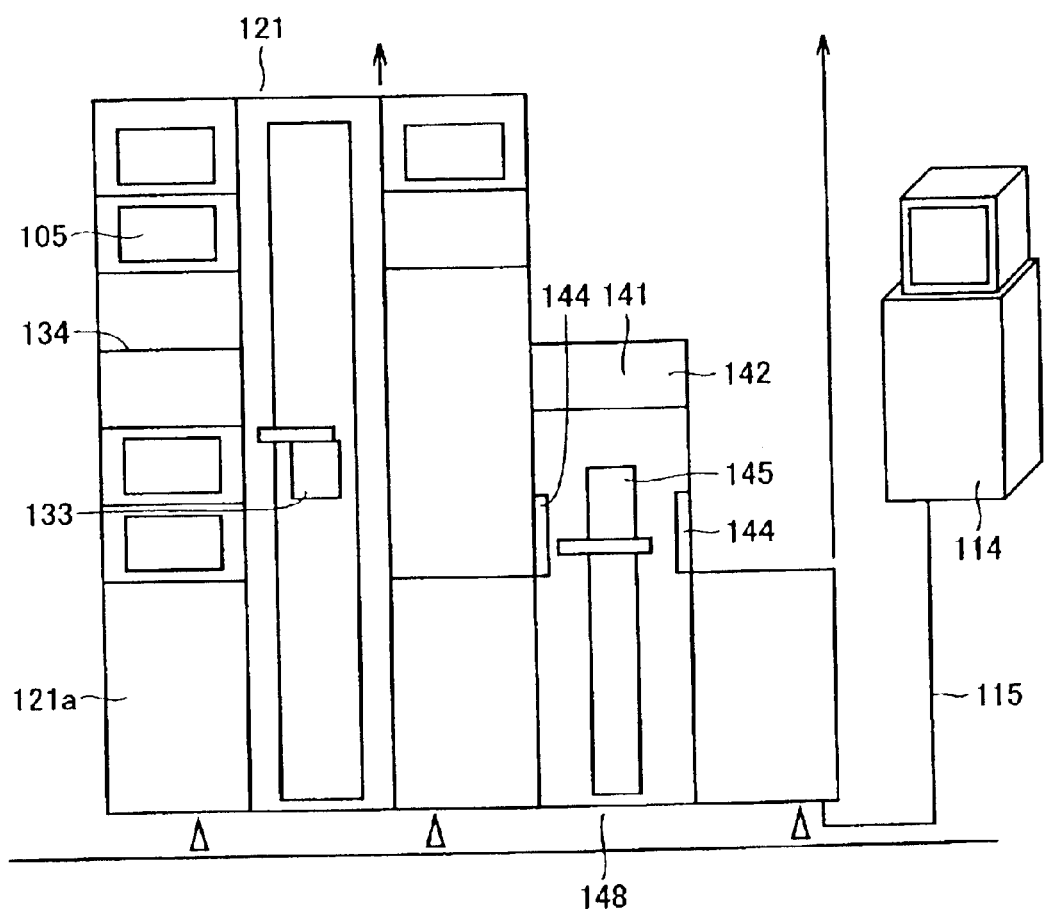
FIG. 30 is a side view showing the hybrid stocker provided in the conventional semiconductor device manufacturing line.
Figure 31:
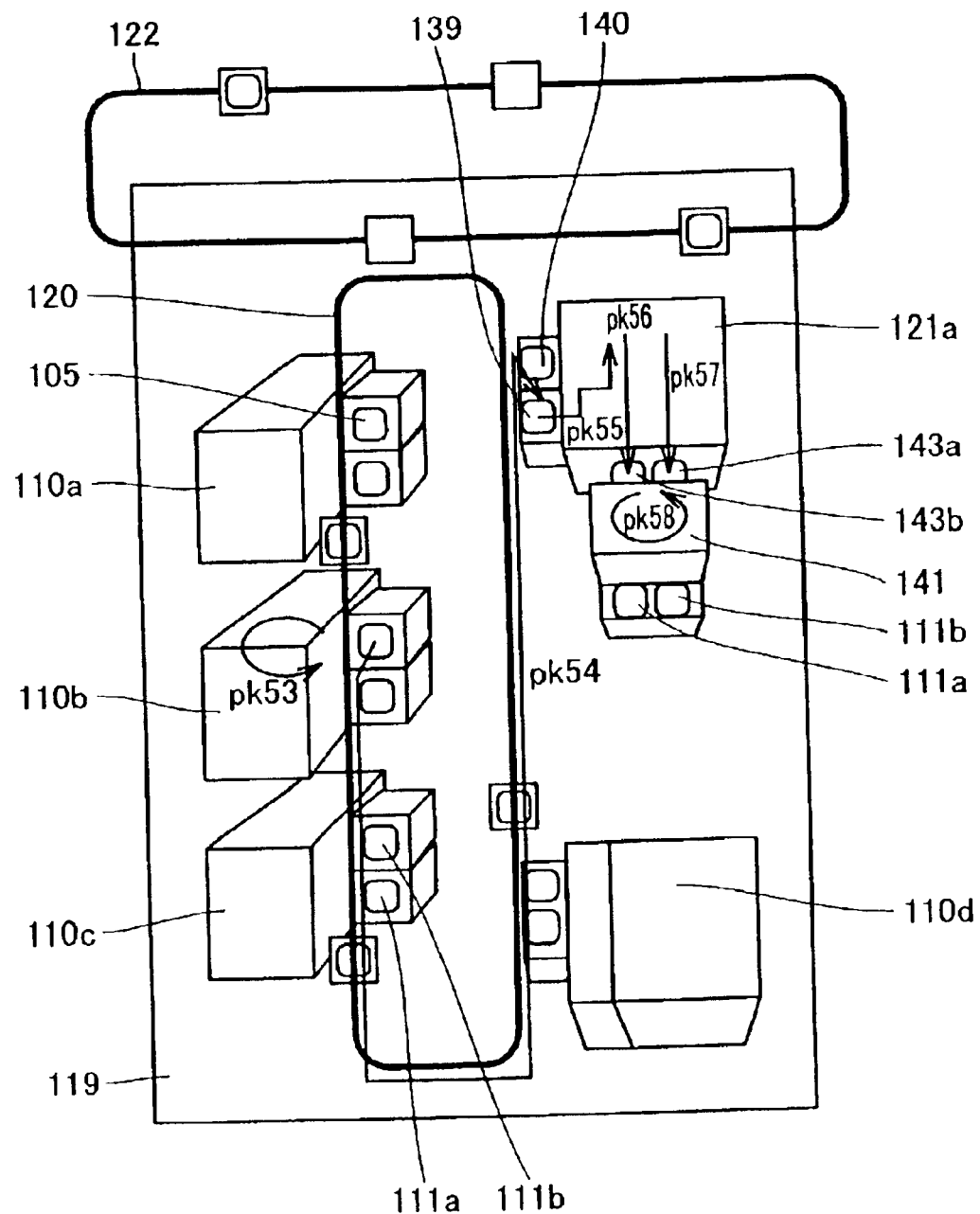
FIG. 31 is a first plan view illustrating a carrier exchanging operation in the conventional semiconductor device manufacturing line.
Figure 32:
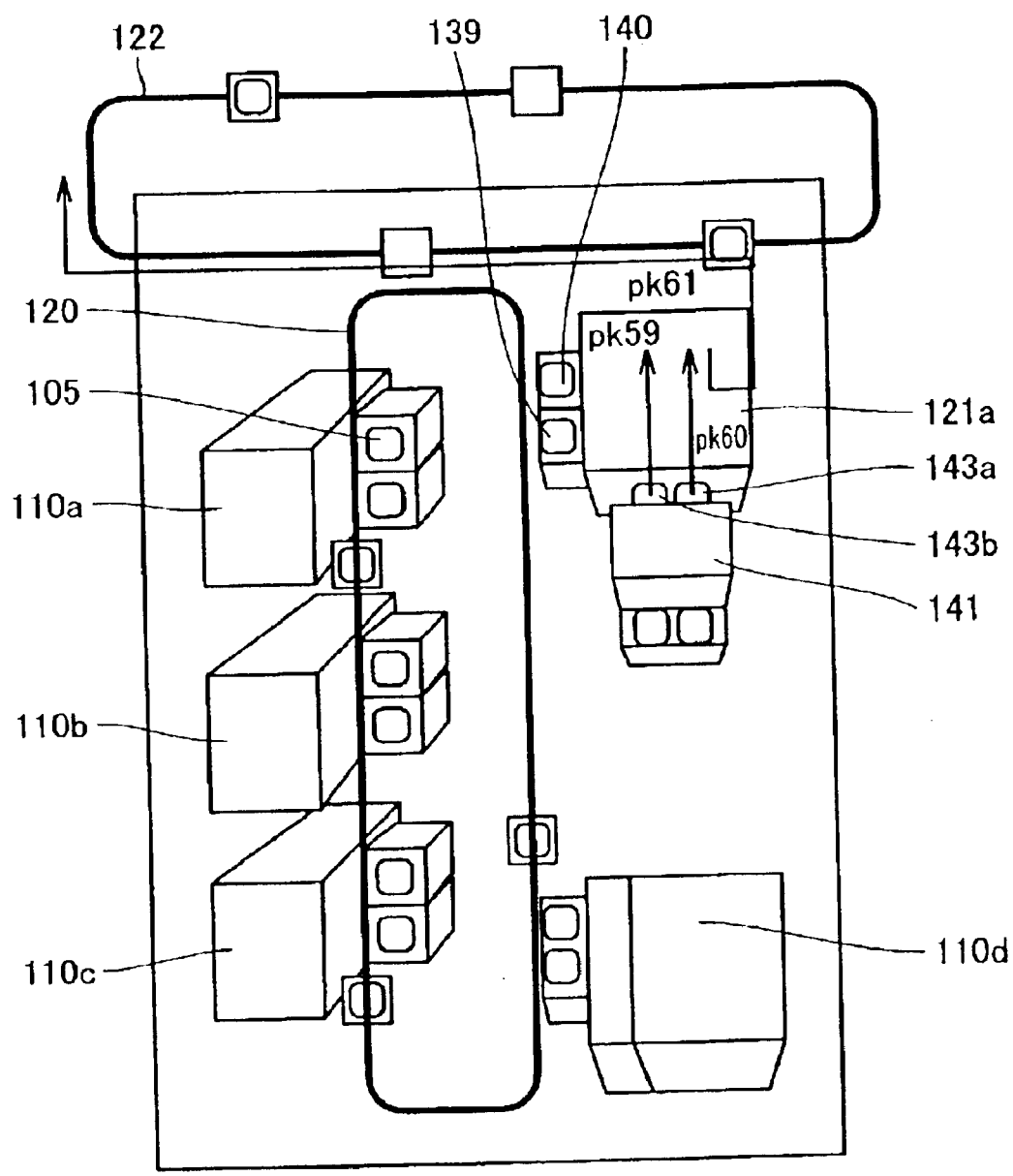
FIG. 32 is a second plan view illustrating the carrier exchanging operation in the conventional semiconductor device manufacturing line.
Figure 33:
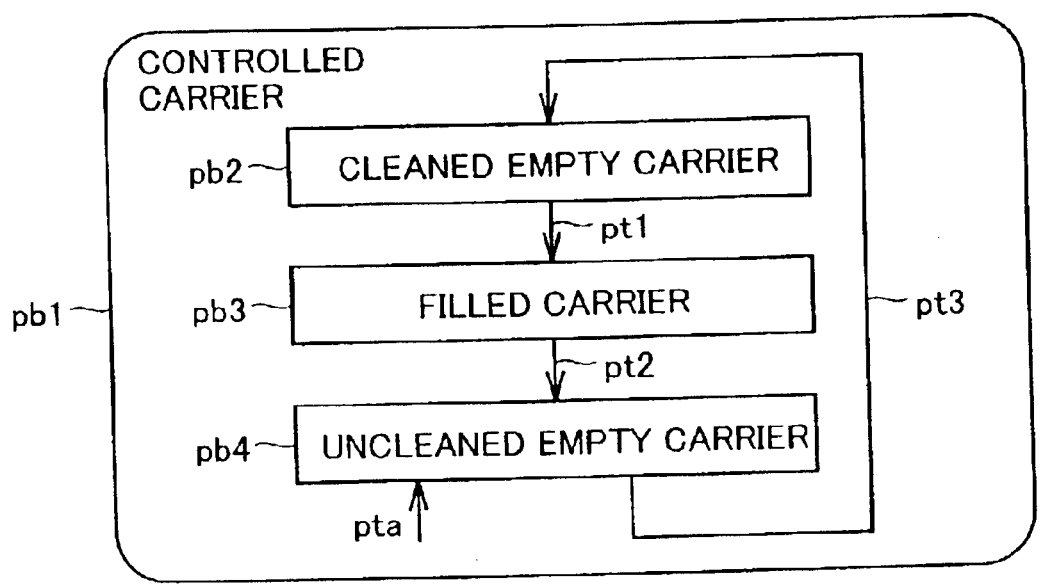
FIG. 33 is a block diagram showing the states of the carrier in the conventional semiconductor device manufacturing line.

Then, as shown in FIG. 20, after the operation of transporting the product wafer is completed, the emptied carrier is once accommodated in hybrid stocker 21a (operation k59). On the other hand, the carrier accommodating the product wafer is once accommodated in hybrid stocker 21a (operation k60).

The carrier accommodating the product wafer is conveyed by inter-bay transfer apparatus 22 to a bay in which processing in a next step is performed (operation k61), followed by the next wafer step starting operation.

On the other hand, the emptied carrier is handled by the host computer as follows. In carrier exchanging operation 31, when the carrier in the filled carrier state b7 is emptied by the transfer of the product wafer, the carrier history such as the elapsed time after cleaning, the number of times of use in carrier exchanging operation 31 and the like is referred for that carrier to determine whether it is reusable.

The carrier determined as being reusable enters a reusable empty carrier state b8 from filled carrier state b7 depending on the purpose of use (state transition t6).

Each carrier thus registered in the host computer is repeatedly used under the condition of the same purpose of use until it is determined as being non-reusable. In case of FIG. 18, for example, three kinds of carrier state b8a–b8c are set depending on the purpose of use.

On the other hand, the carrier determined as being non-reusable enters an uncleaned empty carrier state b9 (state transition t6). The carrier entering uncleaned empty carrier state b9 is transferred by inter-bay transfer apparatus 22 to carrier cleaning apparatus 60 for cleaning based on the instruction of the host computer.

The cleaned carrier as being cleaned enters an empty carrier state b6 (state transition t8) and that carrier is repeatedly used in carrier exchanging operation 31.

In the carrier exchanging operation as described above, the information on the carrier history such as the elapsed time after cleaning, the purpose of use input at the initial use, the number of times of use and the like is handled by the host computer.

Therefore it is easily determined whether the carrier emptied by the transfer of the product wafer is still reusable as an empty carrier. If determined as being reusable, that empty carrier is accommodated in hybrid stocker 21a for waiting for the next use.

On the other hand, if it is determined that the empty carrier is no longer used as an empty carrier, that empty carrier is transferred to the cleaning apparatus for cleaning. In this manner the empty carrier continues being used as an empty carrier based on prescribed carrier history.

Therefore, as compared with the conventional carrier exchanging operation in which cleaning is performed on an empty carrier each time a carrier is emptied, the empty carrier is cleaned appropriately based on the carrier history.

As a result, it is less likely that the transfer of the container mounted with a semiconductor wafer and the transfer for the empty container affect each other due to the frequent transfer of the empty container, so that an efficient transfer can be realized.

Furthermore, it is possible to reduce unnecessary steps of cleaning an empty carrier, to minimize the number of cleaning apparatuses as required, and to cut down on the running cost in the cleaning step.

In addition, the carrier is less frequently cleaned and the lifetime of the carrier can be prolonged.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device manufacturing line for manufacturing a semiconductor device using a container accommodating a semiconductor wafer, comprising:
- a manufacturing apparatus for performing prescribed processing on a semiconductor wafer;
- a check apparatus for checking whether the processing performed on said semiconductor wafer by said manufacturing apparatus is appropriate;
- one container and another container for respectively accommodating a prescribed number of semiconductor wafers;
- a wafer transport apparatus configured for taking a prescribed semiconductor wafer determined as not being processed appropriately and requiring rework processing out of a prescribed number of said semiconductor wafers checked by said check apparatus and accommodated in said one container to transport said prescribed semiconductor wafer from one container into another container, and returning said prescribed semiconductor wafer transported into said another container and subjected to the rework processing, into said one container;
- a storage apparatus for storing said one container and said another container;
- a transfer apparatus for transferring said one container and said another container to said manufacturing apparatus, said check apparatus, said storage apparatus and said wafer transport apparatus; and
- a control apparatus for controlling operations of said manufacturing apparatus, said check apparatus, said storage apparatus, said wafer transport apparatus, and said transfer apparatus, wherein
  said control apparatus is configured for
    providing an instruction of storing said one container to said storage apparatus,
    specifying said prescribed semiconductor wafer based on a check result by said check apparatus of said semiconductor wafers accommodated in said one container and providing to said wafer transport apparatus an instruction of transporting said specified, prescribed semiconductor wafer into said another container,
    forming a rework lot for said another container into which said prescribed semiconductor wafer is transported,
    providing an instruction of performing rework processing on said prescribed semiconductor wafer to said manufacturing apparatus,
    providing to said wafer transport apparatus an instruction of returning said prescribed semiconductor wafer subjected to the rework processing and accommodated in said another container, into said one container, and
    regarding said rework lot as being completed after said prescribed semiconductor wafer is transported into said one container.

2. The semiconductor device manufacturing line according to claim 1, wherein
said control apparatus is further configured for
dividing said prescribed semiconductor wafers into at least two depending on a degree of rework processing, based on a check result by said check apparatus, and
providing to said wafer transport apparatus an instruction of transporting said divided prescribed semiconductor wafers into said another container and into an additional container, respectively, and an instruction of returning said prescribed semiconductor wafers respectively subjected to rework processing and accommodated in said another container and said additional container, into said one container.

3. A semiconductor device manufacturing line for manufacturing a semiconductor device using a container accommodating a semiconductor wafer, comprising:
- a plurality of containers each capable of accommodating a prescribed number of semiconductor wafers;
- a storage apparatus for storing a plurality of said containers;
- a wafer transport apparatus configured for transporting said semiconductor wafer accommodated in one container of a plurality of said containers into another container;
- a container cleaning apparatus for cleaning a plurality of said containers;
- a transfer apparatus for transferring a plurality of said containers respectively to said storage apparatus, said wafer transport apparatus and said container cleaning apparatus; and
- a prescribed control apparatus, wherein
  said control apparatus is configured for
    handling information regarding a container history including an elapsed time after cleaning by said container cleaning apparatus, the number of times of exchange, and a purpose of use, for each of a plurality of said containers, and
    operating said storage apparatus, said wafer transport apparatus, said container cleaning apparatus, and said transfer apparatus, based on said information regarding a container history.

4. The semiconductor device manufacturing line according to claim 3, wherein
said control apparatus is configured for
allocating as said another container an empty container that meets a purpose of use or an unused empty container after cleaning, based on said container history for each of a plurality of said containers,
determining whether said one container is reusable as an empty container based on a container history of said one container which is emptied by transporting said semiconductor wafer accommodated in said one container into said another container,
providing an instruction of storing said one container to said storage apparatus if it is determined that said one container is reusable as an empty container, and
providing an instruction of cleaning said one container to said container cleaning apparatus if it is determined that said one container is not reusable as an empty container.

* * * * *